US012757769B2

(12) United States Patent
Morinaga

(10) Patent No.: US 12,757,769 B2
(45) Date of Patent: Oct. 6, 2026

(54) SEMICONDUCTOR MODULE

(71) Applicant: SHINDENGEN ELECTRIC MANUFACTURING CO., LTD., Tokyo (JP)

(72) Inventor: Yuji Morinaga, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 413 days.

(21) Appl. No.: 18/604,500

(22) Filed: Mar. 14, 2024

(65) Prior Publication Data

US 2024/0347466 A1 Oct. 17, 2024

(30) Foreign Application Priority Data

Mar. 16, 2023 (JP) ................................ 2023-042367

(51) Int. Cl.
*H10W 70/65* (2026.01)
*H02M 7/00* (2006.01)
*H10W 44/00* (2026.01)
*H10W 70/40* (2026.01)
(Continued)

(52) U.S. Cl.
CPC ......... *H10W 70/65* (2026.01); *H10W 44/501* (2026.01); *H10W 70/415* (2026.01); *H10W 72/926* (2026.01); *H10W 90/00* (2026.01); *H10W 90/811* (2026.01); *H02M 7/003* (2013.01); *H10W 90/751* (2026.01); *H10W 90/755* (2026.01)

(58) Field of Classification Search
CPC . H10W 70/65; H10W 70/415; H10W 72/926; H10W 72/931; H10W 72/932; H10W 72/936; H10W 72/90; H10W 90/00; H10W 90/751; H10W 90/755; H10W 90/811; H02M 7/003; H02M 7/162–1626
See application file for complete search history.

(56) References Cited

U.S. PATENT DOCUMENTS

2007/0252265 A1* 11/2007 Sander .................. H10W 72/60 257/691
2018/0367054 A1* 12/2018 Morinaga ............. H02M 7/003
2024/0312921 A1* 9/2024 Morinaga ........... H10W 70/611
(Continued)

FOREIGN PATENT DOCUMENTS

WO 2020241239 A1 12/2020

*Primary Examiner* — Steven B Gauthier
*Assistant Examiner* — Candice Chan
(74) *Attorney, Agent, or Firm* — HAUPTMAN HAM, LLP

(57) ABSTRACT

In a semiconductor module that includes four semiconductor chips Q1 to Q4, four wiring patterns, first and second power source terminals and first and second intermediate point terminals thus forming a bridge circuit in the semiconductor. The bridge circuit is formed where the chip Q1 and the chip Q3 are disposed on a high side and the chip Q2 and the chip Q4 are disposed on a low side. In a recessed portion that is formed in the wiring pattern, a wiring pattern on which a protruding portion having a first oblique side and a second oblique side is formed is disposed. Oblique sides parallel to the first oblique side and the second oblique side are formed on wiring patterns. The chips Q2, Q4 are obliquely arranged along the respective oblique sides. The wiring pattern functions as a current path from the intermediate point terminals to the power source terminal.

4 Claims, 10 Drawing Sheets

(51) Int. Cl.
*H10W 72/90* (2026.01)
*H10W 90/00* (2026.01)

(56) References Cited

U.S. PATENT DOCUMENTS

| | | | | |
|---|---|---|---|---|
| 2024/0312922 | A1* | 9/2024 | Morinaga | H10W 44/501 |
| 2024/0379572 | A1* | 11/2024 | Morinaga | H10W 20/496 |
| 2025/0309023 | A1* | 10/2025 | Morinaga | H02M 7/003 |

* cited by examiner

| | SEMICONDUCTOR MODULE 1A | SEMICONDUCTOR MODULE 1 |
|---|---|---|
| CURRENT PATH A | 48.4nH | 20.6nH |
| CURRENT PATH B | 36.3nH | 19.2nH |

FIG.7

| | SEMICONDUCTOR MODULE 1A | SEMICONDUCTOR MODULE 1 |
|---|---|---|
| FIRST SEMICONDUCTOR CHIP Q1 | 134.52°C | 134.30°C |
| SECOND SEMICONDUCTOR CHIP Q2 | 141.55°C | 134.56°C |
| THIRD SEMICONDUCTOR CHIP Q3 | 134.51°C | 134.29°C |
| FOURTH SEMICONDUCTOR CHIP Q4 | 141.54°C | 134.45°C |

FIG.9

SEMICONDUCTOR MODULE

RELATED APPLICATIONS

The present application claims priority to Japanese Application Number 2023-042367, filed Mar. 16, 2023, the disclosures of which is hereby incorporated by reference herein in its entirety.

TECHNICAL FIELD

The present invention relates to a semiconductor module.

BACKGROUND ART

Conventionally, there has been popularly adopted a configuration where a bridge circuit is formed of a plurality of semiconductor chips. In the bridge circuit, there is a case where an electric power loss or ringing occurs attributed to a parasitic inductance in a circuit. Particularly, in a case where a wide band gap semiconductor is used as a semiconductor chip, such a semiconductor exhibits a high through rate and a high operation frequency and hence, an electric power loss or ringing is likely to be generated due to a parasitic inductance in a circuit. The magnitude of the parasitic inductance largely depends on a wiring path length (also referred to as a current path length) and hence, the modularization of a circuit is also considered for reducing the parasitic inductance (see patent literature 1, for example).

However, the simple modularization of a circuit is insufficient to acquire an effect of reducing a parasitic inductance, and this state has been considered as a problem. That is, in a semiconductor device 900 disclosed in patent literature 1, a current path when both a first semiconductor chip Q1 and a fourth semiconductor chip Q4 are in an ON state, as indicated by a solid line A in FIG. 10, is a path where a current flows from a first power source terminal 911, flows through the first semiconductor chip Q1 and reaches a first intermediate point terminal 921, and flows through a load not illustrated in the drawing from the first intermediate point terminal 921 and, thereafter, flows from a second intermediate point terminal 922, flows through the fourth semiconductor chip Q4, and reaches a second power source terminal 912.

On the other hand, a current path when both a third semiconductor chip Q3 and a second semiconductor chip Q2 are in an ON state is, as illustrated by a broken line B in FIG. 10, a path where a current flows from the first power source terminal 911 and flows through the third semiconductor chip Q3, flows from the second intermediate point terminal 922 and flows through the load not illustrated in the drawing and, thereafter, flows from the first intermediate point terminal 921, flows through the second semiconductor chip Q2, and reaches the second power source terminal 912.

In a state where both the first semiconductor chip Q1 and the fourth semiconductor chip Q4 are in an ON state, both the third semiconductor chip Q3 and the second semiconductor chip Q2 are in an OFF state. On the other hand, in a state where both the third semiconductor chip Q3 and the second semiconductor chip Q2 are in an ON state, both the first semiconductor chip Q1 and the fourth semiconductor chip Q4 are in an OFF state. In the description made below, however, the description with respect to the state where both semiconductor chips are in an OFF state is omitted.

PATENT LITERATURE

PTL 1: PCT No. 2020/241239

SUMMARY OF INVENTION

Technical Problem

In the semiconductor device 900 disclosed in patent literature 1, as illustrated in FIG. 10, both the current path (indicated by a solid line A) when both the first conductor chip Q1 and the fourth conductor chip Q4 are turned on and the current path (indicated by a broken line B) when both the third semiconductor chip Q3 and the second semiconductor chip Q2 are turned on become long. As a result, in the semiconductor device disclosed in patent literature 1, there exists a drawback that a parasitic inductance is increased.

Further, in addition to the problem relating the parasitic inductance, the interference of heats between the semiconductor chips generated by the first to fourth semiconductor chips Q1 to Q4 also becomes a problem. To overcome such a problem, it is necessary to arrange the semiconductor chips such that a distance between the respective semiconductor chips is widened so as to prevent the heats of the semiconductor chips from interfering with each other. However, when the distance between the semiconductor chips is widened, a current path becomes long thus giving rise to a drawback that a parasitic inductance is increased. Particularly, in the semiconductor device 900 disclosed in patent literature 1, the second semiconductor chip Q2 and the fourth semiconductor chip Q4 are disposed adjacently to each other and are arranged parallel to each other and hence, the interference between the heats of the second and fourth semiconductor chips Q2, Q4 is liable to occur.

The present invention has been made to overcome the above-mentioned drawbacks, and it is an object of the present invention to provide a semiconductor module that can suppress the interference between heats of semiconductor chips while realizing the reduction of a parasitic inductance.

Solution to Problem

A semiconductor module according the present invention is a semiconductor module that includes: first to fourth semiconductor chips; first to fourth wiring patterns; a first power source terminal; a second power source terminal; a first intermediate point terminal; and a second intermediate point terminal thus forming a bridge circuit in the semiconductor module, wherein the bridge circuit is formed where the first semiconductor chip and the third semiconductor chip are chips disposed on a high side, and the second semiconductor chip and the fourth semiconductor chip are chips disposed on a low side, wherein the first power source terminal is connected to the first wiring pattern and the first semiconductor chip and the third semiconductor chip are mounted on the first wiring pattern, the second power source terminal is connected to the second wiring pattern, the first intermediate point terminal is connected to the third wiring pattern and the second semiconductor chip is mounted on the third wiring pattern, and the second intermediate point terminal is connected to the fourth wiring pattern and the fourth semiconductor chip is mounted on the fourth wiring pattern, the first wiring pattern is configured such that, assuming one side out of a plurality of sides of the first wiring pattern as a first side of the first wiring pattern, a recessed portion having a recessed shape as viewed in a plan view is formed in the first wiring pattern within a predetermined range of the first side, and the first semiconductor chip and the third semiconductor chip sandwich the recessed portion, and, are mounted at positions disposed adjacently to the recessed portion, the second wiring pattern is configured such that three sides of the second wiring pattern is surrounded by the recessed portion formed in the first wiring pattern, a portion of the second wiring pattern is disposed so as to protrude outward from an opening of the recessed portion, and a protruding portion having a tapered shape that has a first oblique side and a second oblique side is formed on at least a part of the portion that protrudes from the recessed portion, the third wiring pattern and the fourth wiring pattern are disposed along the one side of the first wiring pattern from one end portion to the other end portion, an oblique side that extends along the first oblique side that the protruding portion having a tapered shape has is formed on the third wiring pattern, and an oblique side that extends along the second oblique side that the protruding portion having a tapered shape has is formed on the fourth wiring pattern, the first to fourth semiconductor chips each have at least a first electrode and a second electrode, the first semiconductor chip is configured such that, assuming one side out of a plurality of sides of the first semiconductor chip as a first side of the first semiconductor chip, the first side of the first semiconductor chip is disposed along the first side of the first wiring pattern, and the first electrode that the first semiconductor chip has is connected to the third wiring pattern via a first connection member the second semiconductor chip is configured such that, assuming one side out of a plurality of sides of the second semiconductor chip as a first side of the second semiconductor chip, the first side of the second semiconductor chip is disposed along the oblique side formed on the third wiring pattern, and the first electrode that the second semiconductor chip has is connected to the second wiring pattern via a second connection member, the third semiconductor chip is configured such that, assuming one side out of a plurality of sides of the third semiconductor chip as a first side of the third semiconductor chip, the first side of the third semiconductor chip is disposed along the first side of the first wiring pattern, and the first electrode that the third semiconductor chip has is connected to the fourth wiring pattern via a third connection member, and the fourth semiconductor chip is configured such that, assuming one side out of a plurality of sides of the fourth semiconductor chip as a first side of the fourth semiconductor chip, the first side of the fourth semiconductor chip is disposed along the oblique side formed on the fourth wiring pattern, and the first electrode that the fourth semiconductor chip has is connected to the second wiring pattern via a fourth connection member.

Advantageous Effects of the Present Invention

In the semiconductor module according to the present invention, the second semiconductor chip is mounted on the third wiring pattern that is arranged on the wiring path from the first semiconductor chip to the first intermediate point terminal, and the second semiconductor chip is connected to the second wiring pattern by the second connection member. Further, on the side of the portion of the third wiring pattern, the oblique side that extends along the first oblique side of the protruding portion having a tapered shape of the second wiring pattern is formed, and the second semiconductor chip is also arranged along the oblique side. With such a configuration, the second semiconductor chip and the second wiring pattern can be connected with each other by the second connection member with a shortest distance and hence, it is possible to shorten a length of the wiring from the first intermediate point terminal to the second power source terminal that is a current path passing the second semiconductor chip and hence, a parasitic inductance can be reduced.

In the same manner, the fourth semiconductor chip is mounted on the fourth wiring pattern that is arranged on the wiring path from the third semiconductor chip to the second intermediate point terminal, and the fourth semiconductor chip is connected to the second wiring pattern by the fourth connection member. Further, on the side of the portion of the fourth wiring pattern, the oblique side that extends along the second oblique side of the protruding portion having a tapered shape of the second wiring pattern is formed, and the fourth semiconductor chip is also arranged along the oblique side. With such a configuration, the fourth semiconductor chip and the second wiring pattern can be connected with each other by the fourth connection member with a shortest distance and hence, it is possible to shorten a length of the wiring from the second intermediate point terminal to the second power source terminal that is a current path passing the fourth semiconductor chip and hence, a parasitic inductance can be reduced.

Further, in the semiconductor module according to the present invention, the present invention has an advantageous effect also from a viewpoint of the suppression of interference of heats of the semiconductor chips. Particularly, the second semiconductor chip and the fourth semiconductor chip adopt the oblique arrangement along the respective oblique sides of the wiring patterns on which these semiconductors are mounted. Accordingly, a distance between the second semiconductor chip and the fourth semiconductor chip becomes wide compared to a case where these semiconductor chips (the second semiconductor chip and the fourth semiconductor chip) are disposed adjacently to each other and are disposed parallel to each other. As a result, it is possible to easily dissipate the heats that the second semiconductor chip and the fourth semiconductor chip generate and hence, the semiconductor module minimally receives the interference of heats of the semiconductor chips whereby it is possible to suppress the interference of heats of the semiconductor chips.

Specifically, assuming the neighboring sides where the third wiring pattern on which the second semiconductor chip is mounted and the fourth wiring pattern on which the fourth semiconductor chip is mounted are disposed adjacently to each other as a neighboring side on a third wiring pattern side and a neighboring side on a fourth wiring pattern side, a distance between the second semiconductor chip and the neighboring side on a third wiring pattern side is widened and, at the same time, a distance between the fourth semiconductor chip and the neighboring side on a fourth wiring pattern side is widened. Accordingly, a distance between the semiconductor chip Q2 and the semiconductor chip Q4 is widened compared to a case where the semiconductor chip Q2 and the semiconductor chip Q4 are arranged parallel to each other and are disposed adjacently to each other.

To briefly explain the above with reference to FIG. 2 that is used in the Description of Embodiments described later (the detail being explained in the embodiment described later), the distance between the side b1 (first long side b1) of the second semiconductor chip Q2 and the neighboring side 33 (right side 33) on a third wiring pattern 30 side is gradually widened toward a side a2 (second short side a2) side of the second semiconductor chip Q2. The same substantially goes for the fourth semiconductor chip Q4. The distance between the side b2 (second long side b2) of the fourth semiconductor chip Q4 and the neighboring side 43 (left side 43) on a fourth wiring pattern 40 side is gradually widened toward a side a2 (second short side a2) side of the fourth semiconductor chip Q4.

Accordingly, the distance between the second semiconductor chip Q2 and the fourth semiconductor chip Q4 becomes large compared to the corresponding width in a case where the second semiconductor chip Q2 and the fourth semiconductor chip Q4 are disposed adjacently to each other and are disposed parallel to each other. For example, to compare the semiconductor module according to the present invention with the semiconductor device 900 (see FIG. 10) described in patent literature 1 described above and a semiconductor module 1A (see FIG. 5) used in a comparison example, in the semiconductor device 900 (see FIG. 10) described in patent literature 1 and the semiconductor module 1A used in the comparison example, the semiconductor chips Q2, Q4 are disposed adjacently to each other and are disposed parallel to each other and hence, the second and fourth semiconductor chips are liable to receive the interference of heats. To the contrary, in the present invention, the second semiconductor chip Q2 and the fourth semiconductor chips Q4 adopt the oblique arrangement where the second and fourth semiconductor chips Q2, Q4 extend along the respective oblique sides of the wiring patterns on which the second and fourth semiconductor chips Q2, Q4 are mounted. With such arrangement, the distance between the semiconductor chip Q2 and the semiconductor chip Q4 is widened and hence, the interference of heats of the second and fourth semiconductor chips can be suppressed whereby it is possible to suppress the increase of temperatures of the second semiconductor chip Q2 and the fourth semiconductor chip Q4.

Further, a semiconductor chip that is also a heat generating source is not mounted on the second wiring pattern. Accordingly, a temperature of the second wiring pattern can be set lower than a temperature of the third wiring pattern on which the second semiconductor chip a is mounted and temperature of the fourth wiring pattern on which the fourth semiconductor chip is mounted. Heat is transferred from a side where a temperature is high to a side where a temperature is low and hence, by arranging the second wiring pattern of a low temperature between the second semiconductor chip that is also a heat generating source and the fourth semiconductor chip that is also a heat generating source, the interference of heats of the second semiconductor chip and the fourth semiconductor chip can be reduced and hence, the increase of temperatures of the second semiconductor chip and the fourth semiconductor chip can be suppressed.

In this manner, according to the semiconductor module of the present invention, it is possible to provide a semiconductor module that can suppress the interference between heats of semiconductor chips while realizing the reduction of a parasitic inductance.

BRIEF DESCRIPTION OF DRAWINGS

FIG. 7 is a table illustrating a measurement result of a parasitic inductance generated in the semiconductor module 1 according to the embodiment and a parasitic inductance generated in the semiconductor module 1A.

FIG. 9 is a table illustrating a measurement result obtained by measuring temperatures of the semiconductor chips Q1 to Q4 of the semiconductor module 1 according to the embodiment and a measurement result obtained by measuring temperatures of the semiconductor chips Q1 to Q4 of the semiconductor module 1A.

DESCRIPTION OF EMBODIMENTS

Hereinafter, an embodiment of the semiconductor module of the present invention is described.

Figure 1:
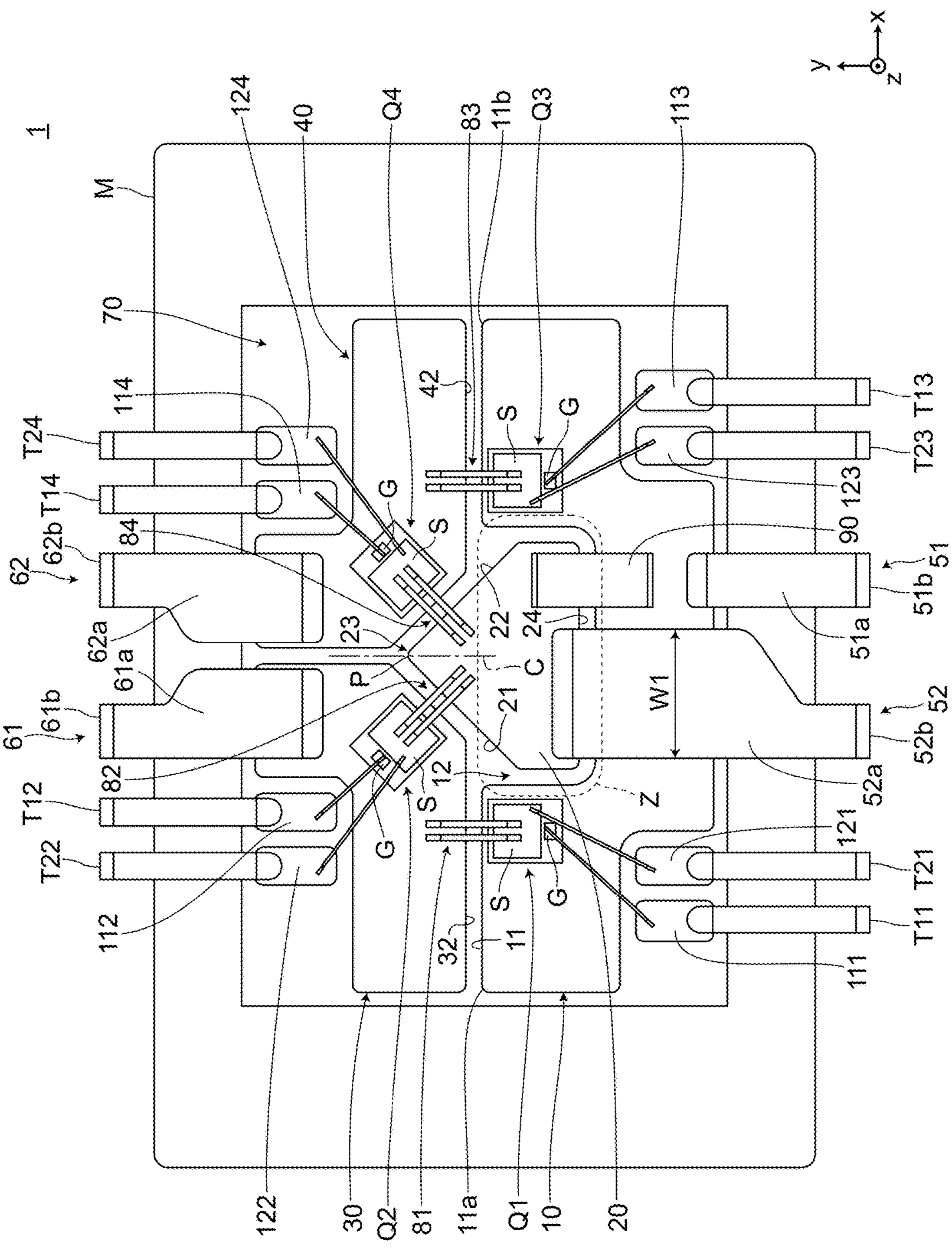
FIG. 1 is a plan view of the internal configuration of a semiconductor module 1 according to an embodiment.

FIG. 1 is a view illustrating an internal configuration of a semiconductor module 1 according to the embodiment as viewed in a plan view.

Figure 2:
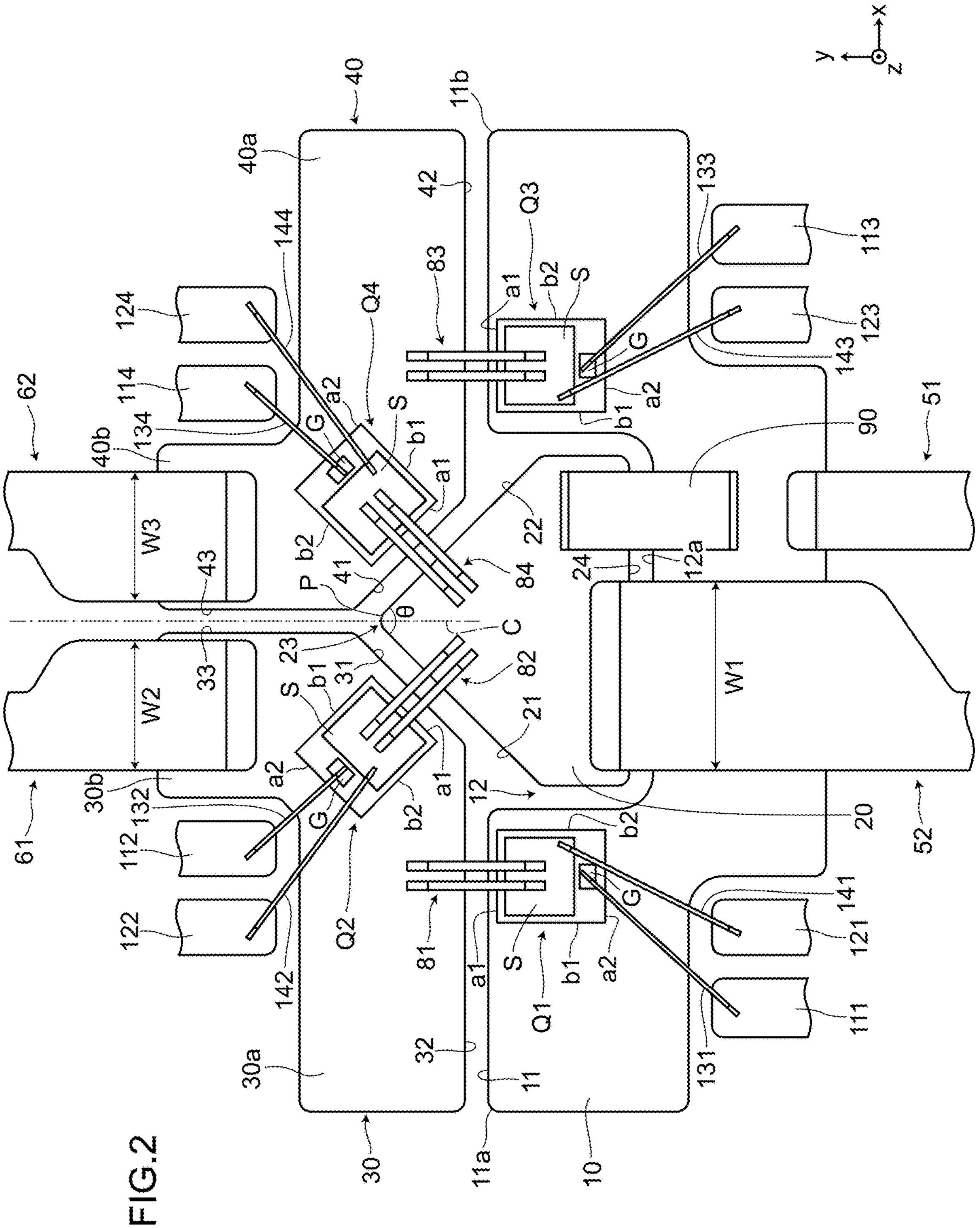
FIG. 2 is an enlarged view of a main part of the semiconductor module 1 illustrated in FIG. 1.

FIG. 2 is a view illustrating a main part of the semiconductor module 1 illustrated in FIG. 1 in an enlarged manner. In FIG. 2, as the main part of the semiconductor module 1 illustrated in FIG. 1, mainly, first to fourth wiring patterns (conductive patterns) 10 to 40, semiconductor chips Q1 to Q4 mounted on the first to fourth wiring patterns 10 to 40, first and second power source terminals 51, 52, and first and second intermediate point terminals 61, 62 are described.

To prevent the drawing from becoming cumbersome, in FIG. 1, symbols given to some constitutional elements are omitted. However, these symbols are illustrated in FIG. 2. Hereinafter, the internal configuration of the semiconductor module 1 is described with reference to FIG. 1 and FIG. 2.

The semiconductor module 1 according to the embodiment includes the first to fourth semiconductor chips Q1 to Q4, the first to fourth wiring patterns 10 to 40, the first power source terminal 51, the second power source terminal 52, the first intermediate point terminal 61 and the second intermediate point terminal 62 thus forming a bridge circuit in the semiconductor module 1. The bridge circuit is formed in a state where the first semiconductor chip Q1 and the third semiconductor chip Q3 are chips disposed on a high side, and the second semiconductor chip Q2 and the fourth semiconductor chip Q4 are chips disposed on a low side. In such a bridge circuit, an operation that turns on both the first semiconductor chip Q1 and the fourth semiconductor chip Q4, and an operation that turns on both the third semiconductor chip Q3 and the second semiconductor chip Q2 are alternately repeated.

The first to fourth wiring patterns 10 to 40 are formed of the first wiring pattern 10, the second wiring pattern 20, the third wiring pattern 30 and the fourth wiring pattern 40. In the description made hereinafter, in a case where the first to fourth semiconductor chips Q1 to 04 are collectively described, "first", "second", and the like may be omitted and the expression "semiconductor chips Q1 to Q4" may be adopted. Further, the first to fourth wiring patterns 10 to 40 may be also expressed as "wiring patterns 10 to 40" by omitting "first", "second", and the like in a case where the first to fourth wiring patterns 10 to 40 are collectively described.

In the semiconductor module 1 according to the embodiment, the description is made by assuming the semiconductor chips Q1 to Q4 are each formed of a metal oxide semiconductor field effect transistor (MOSFET), and have a rectangular shape in a plan view. Further, in the semiconductor module 1 according to the embodiment, assume that on a direct copper bonding (DCB) substrate 70 that is formed by directly bonding metal (copper) to a base made of ceramic (alumina, aluminum nitride, silicon nitride or the like), the wiring patterns 10 to 40 are formed. The substrate used in the semiconductor module of the present invention is not limited to the DCB substrate, and other ceramic substrates such as an active metal brazing (AMB) substrate, a metal base substrate such as a copper base or an aluminum base and the like can be also used. As metal bonded to the ceramic substrate, metal other than copper (for example, aluminum) can be also used.

The semiconductor chips Q1 to Q4 each include a source electrode (a first electrode) S, a drain electrode (a second electrode) D, and a gate electrode (a control electrode) G. The drain electrode D in a case where a vertical transistor chip (a vertical transistor chip such as a MOSFET or the like formed using Si or SiC material) is used as the semiconductor chips Q1 to Q4, is formed on a surface of the semiconductor chips Q1 to Q4 on surfaces of wiring patterns 10 to 40 side (a back surfaces of semiconductor chips Q1 to Q4). In the semiconductor module 1 according to the embodiment, the case is exemplified where the vertical transistor chip is used as the semiconductor chips Q1 to Q4. Accordingly, the drain electrode D is disposed on the wiring patterns 10 to 40 side and hence, the drain electrode D cannot be visually recognized thereby a symbol "D" that indicates the drain electrode is not illustrated. Further, the gate electrode G is disposed on surfaces of the semiconductor chips Q1 to Q4 on a source electrode S side.

Further, the semiconductor chips Q1 to Q4 are suitably changeable within a range that the gist of the present invention is not changed. For example, as the semiconductor chips Q1 to Q4, for example, a lateral-type transistor chip (for example, a GaN-HEMT made of a GaN on Si material, or a compound semiconductor transistor made of a $Ga_2O_3$ on Si material or the like) may be also used. In the case of the lateral-type transistor chip, it is preferable that gate electrodes G and source electrodes S may preferably be formed in plurals on a surface of the semiconductor chip including the drain electrode D. Further, semiconductor chips Q1 to Q4 are not limited to a transistor chip, may have a modified configuration where a transistor chip is replaced with a diode chip corresponding to a circuit application. By adopting such a modified configuration, the present invention is also applicable to a suitable totem pole type bridgeless PFC circuit and the like.

Assuming one side 11 out of a plurality of sides of the first wiring pattern 10 as a first side 11 of the first wiring pattern 10, a recessed portion 12 that is formed in a recessed shape when the first wiring pattern 10 is viewed in a plan view is formed predetermined range of the first side 11. In this embodiment, in the first wiring pattern 10, as illustrated in FIG. 1 and FIG. 2, a side that is positioned on an upper side in the drawing out of sides of the first wiring pattern 10 extending in a left and right direction (a direction along an x axis direction) is set as the first side 11.

The "recessed portion 12" is not a recessed portion that is recessed in a thickness direction of the substrate 70. That is, "recessed portion 12" is a recessed portion that is disposed in a region surrounded by a broken line frame Z in FIG. 1, and is recessed in a recessed shape in a downward direction on a paper surface along a y axis in the drawing on a plane of the substrate 70 when the first wiring pattern 10 is viewed in a plan view.

Further, the first power source terminal 51 is connected to the first wiring pattern 10, and on the first wiring pattern 10, the first semiconductor chip Q1 and the third semiconductor chip Q3 are mounted. In this embodiment, the first semiconductor chip Q1 and the third semiconductor chip Q3 sandwich the recessed portion 12, and are disposed at positions adjacently to the recessed portion 12. Assume that the position at which the recessed portion 12 is formed is substantially in the vicinity of the approximately center of the first wiring pattern 10 in the lateral direction on the paper surface along the x axis illustrated in the drawing.

Subsequently, the second wiring pattern 20 is described. The second wiring pattern 20 is disposed such that the second wiring pattern 20 is surrounded by the recessed portion 12 of the first wiring pattern 10 from three sides, and a portion of the second wiring pattern 20 protrudes outward (in an upward direction on the paper surface along the y axis illustrated in the drawing) from an opening of the recessed portion 12. Further, on at least a portion of the second wiring pattern 20 that protrudes from the recessed portion 12, a protruding portion 23 having a tapered shape that includes a first oblique side 21 and a second oblique side 22 is formed. Hereinafter, "the protruding portion 23 having a tapered shape" may be also expressed as "protruding portion 23" by omitting "having a tapered shape".

A lower side 24 of the second wiring pattern 20 (a side of the second wiring pattern 20 that faces a bottom side 12*a* of the recessed portion 12 of the first wiring pattern 10) is disposed parallel to the bottom surface 12*a* of the recessed portion 12 of the first wiring pattern 10. The second power source terminal 52 is connected to the second wiring pattern 20 (see FIG. 2).

Also assume that the second wiring pattern 20 has a line symmetry shape using a center line C of the second wiring pattern 20 that is orthogonal to a lower side as an axis of symmetry. However, in this embodiment, "line symmetry shape" does not a line symmetry shape in the strict meaning of the term, and includes a line symmetry shape where one side and the other side with respect to the axis of symmetry slightly differ from each other. Further, in the semiconductor module 1 according to the embodiment 1, assume that, in the protruding portion 23, an angle made by the first oblique side 21 and the second oblique side 22 is an acute angle, and the protruding portion 23 has an apex P at a distal end portion of the protruding portion 23. Assume that the center line C is a line that flows through the apex P of the protruding portion 23 and is orthogonal to the lower side 24.

An angle θ (see FIG. 2) made by the first oblique side 21 and the second oblique side 22 of the protruding portion 23 is not particularly limited. However, in the semiconductor module 1 according to the embodiment 1, assume that the angle θ is 90 degrees. Accordingly, an angle made by the first oblique side 21 and the center line C and an angle made by the second oblique side 22 and the center line C are 45 degrees respectively.

Next, the third wiring pattern 30 and the fourth wiring pattern 40 are described. The third wiring pattern 30 and the fourth wiring pattern 40 are disposed along from one end portion (left end portion) 11*a* of the first side 11 of the first wiring pattern 10 to the other end portion (right end portion) 11*b* of the first wiring pattern 10. More specifically, as illustrated in FIG. 1 and FIG. 2, the third wiring pattern 30 is disposed on a left side of the first side 11 of the first wiring pattern 10 in the left-and-right direction along the x axis, and the fourth wiring pattern 40 is disposed on a right side of the first side 11 of the first wiring pattern 10 in the left-and-right direction along the y axis.

The first intermediate point terminal 61 is connected to the third wiring pattern 30, and the second semiconductor chip Q2 is mounted on the third wiring pattern 30. The third wiring pattern 30 includes: a horizontal portion 30*a* (see FIG. 2) that extends in the left-and-right direction of the paper surface along the x axis illustrated in the drawing; and a vertical portion 30*b* (see FIG. 2) that extends in the upper-and-down direction of the paper surface along the y axis illustrated in the drawing from an end portion of the horizontal portion 30*a* (a right end portion on the paper surface illustrated in the drawing). The first intermediate point terminal 61 is connected to the vertical portion 30*b* of the third wiring pattern 30, and extends in the upper direction on the paper surface along the y axis.

An oblique side 31 (see FIG. 2) extending along the first oblique side 21 that the protruding portion 23 of the second wiring pattern 20 has is formed on the third wiring pattern 30. The oblique side 31 is formed on the third wiring pattern 30 at a corner portion between the horizontal portion 30*a* and the vertical portion 30*b*. The oblique side 31 faces the first oblique side 21 of the second wiring pattern 20 and, at the same time, is arranged parallel to the first oblique side 21. The second semiconductor chip Q2 is mounted along the oblique side 31 of the third wiring pattern 30. However, this configuration is described later.

The third wiring pattern 30 having such a configuration is arranged such that a side (assuming a lower side 32) of the horizontal portion 30*a* of the third wiring pattern 30 on a first wiring pattern 10 side extends along the first side 11 of the first wiring pattern 10.

On the other hand, the second intermediate point terminal 62 is connected to the fourth wiring pattern 40, and the fourth semiconductor chip Q4 is mounted on the fourth wiring pattern 40. The fourth wiring pattern 40 includes: a horizontal portion 40*a* (see FIG. 2) that extends in the left-and-right direction of the paper surface along the x axis illustrated in the drawing; and a vertical portion 40*b* (see FIG. 2) that extends in the up-and-down direction of the paper surface along the y axis illustrated in the drawing from an end portion of the horizontal portion 40*a* (a left end portion on the paper surface illustrated in the drawing). The second intermediate point terminal 62 is connected to the vertical portion 40*b* of the fourth wiring pattern 40, and extends in the up direction of the paper surface along the y axis illustrated in the drawing.

An oblique side 41 (see FIG. 2) extending along the second oblique side 22 that the protruding portion 23 of the second wiring pattern 20 has is formed on the fourth wiring pattern 40. The oblique side 41 is formed on the fourth wiring pattern 40 at a corner portion between the horizontal portion 40*a* and the vertical portion 40*b*. The oblique side 41 faces the second oblique side 22 of the second wiring pattern 20 and, at the same time, is arranged parallel to the second oblique side 22. The fourth semiconductor chip Q4 is mounted along the oblique side 41 of the fourth wiring pattern 40. However, this configuration is described later.

The fourth wiring pattern 40 having such a configuration is arranged such that a side (assuming a lower side 42) of the horizontal portion 40*a* of the fourth wiring pattern 40 on a first wiring pattern 10 side is disposed along the first side 11 of the first wiring pattern 10, and a vertical portion 40*b* of the fourth wiring pattern 40 is disposed adjacently to the vertical portion 30*a* of the third wiring pattern 30. More specifically, a right side 33 (see FIG. 2) of the third wiring pattern 30 that faces the fourth wiring pattern 40 at the vertical portion 30*b* of the third wiring pattern 30, and a left side 43 (see FIG. 2) of the fourth wiring pattern 40 that faces the third wiring pattern 30 at the vertical portion 40*b* of the fourth wiring pattern 40 are arranged adjacently to each other. Accordingly, it may be also considered that the right side 33 of the third wiring pattern 30 and the left side 43 of the fourth wiring pattern 40 are neighboring sides where the third wiring pattern 30 and the fourth wiring pattern 40 are disposed adjacently to each other.

In the semiconductor module 1 according to the embodiment, assume that the first wiring pattern 10 has a line symmetry shape using the center line C of the second wiring pattern 20 as an axis of symmetry. Further, the third wiring pattern 30 and the fourth wiring pattern 40 have the same shape, and are arranged such that the third wiring pattern 30 and the fourth wiring pattern 40 have a line symmetry shape using the center line C of the second wiring pattern 20 as an axis of symmetry. However, also in this case, "line symmetry shape" does not a line symmetry shape in the strict meaning of the term, and includes where one side and the other side with respect to the axis of symmetry slightly differ from each other.

By arranging the wiring patterns 10 to 40 in this manner, the second wiring pattern 20 is surrounded by the first wiring pattern 10, the third wiring pattern 30 and the fourth wiring pattern 40 and hence, the second wiring pattern 20 is positioned in the vicinity of the center portion of the substrate 70.

In the semiconductor module 1 according to the embodiment, the semiconductor chips Q1 to Q4 have a quadrangular shape as viewed in a plan view. That is, the semiconductor chips Q1 to Q4 may have a square shape or a rectangular shape. However, in this embodiment, the description is made by assuming that the semiconductor chips Q1 to Q4 have a rectangular shape. With respect to a plurality of sides, that is, the first side to the fourth side of the semiconductor chips Q1 to Q4, the first side and the second side on a side opposite to the first side are formed of a short side respectively, and the third side and the fourth side on a side opposite to the third side are formed of a long side respectively. However, assume that the semiconductor chips Q1 to Q4 have a rectangular shape where the long side is slightly longer than the short side.

As illustrated in FIG. 2, with respect to the semiconductor chips Q1 to Q4, one side that is one short side of each semiconductor chip is referred to as "a first short side a1", a second side that is the other short side is referred to as "a second short side a2", a third side that is one long side is referred to as "a first long side b1", and a fourth side that is the other long side is referred to as "a second long side b2". To describe this configuration by taking the first semiconductor chip Q1 as an example, the first side which is one short side of the semiconductor chip Q1 is referred to as "the first short side a1", the second side that is the other short side is referred to as "the second short side a2", the third side that is one long side is referred to as "the first long side b1", and the fourth side which is the other long side is referred to as "the second long side b2". The same goes for other semiconductor chips Q2 to Q4 (see FIG. 2).

As illustrated in FIG. 2, the first semiconductor chip Q1 mounted on the first wiring pattern 10 is configured such that the first short side a1 that is the first side of the first semiconductor chip Q1 is arranged along the first side 11 of the first wiring pattern 10, and the source electrode S of the first semiconductor chip Q1 is connected to the third wiring pattern 30 by way of the first connection member 81 such as an aluminum wire. The first connection member 81 extends from a side of the first short side a1 that is the first side of the first semiconductor chip Q1 orthogonal to the first short side 1*a*, is connected to the third wiring pattern 30. In such a configuration, the first connection member 81 is also orthogonal to a lower side 32 of the third wiring pattern 30.

As illustrated in FIG. 2, the third semiconductor chip Q3 mounted on the first wiring pattern 10 is configured such that the first short side a1 that is the first side of the third semiconductor chip Q3 is arranged along the first side 11 of the first wiring pattern 10, and the source electrode S of the third semiconductor chip Q3 is connected to the fourth wiring pattern 40 by way of the third connection member 83 such as an aluminum wire. The third connection member 83 extends from a side of the first short side a1 that is the first side of the third semiconductor chip Q3 orthogonal to the first short side a1, is connected to the fourth wiring pattern 40. In such a configuration, the third connection member 83 is also orthogonal to a lower side 42 of the fourth wiring pattern 40.

As illustrated in FIG. 2, the second semiconductor chip Q2 mounted on the third wiring pattern 30 is configured such that the first short side a1 that is the first side of the second semiconductor chip Q2 is arranged along the oblique side 31 formed on the third wiring pattern 30, and the source electrode S of the second semiconductor chip Q2 is connected to the second wiring pattern 20 by way of the second connection member 82 such as an aluminum wire. The second connection member 82 extends from a side of the first short side a1 that is the first side of the second semiconductor chip Q2 orthogonal to the first short side a1, is connected to the second wiring pattern 20. In such a configuration, the second connection member 82 is also orthogonal to the first oblique side 21 of the second wiring pattern 20.

As illustrated in FIG. 2, the fourth semiconductor chip Q4 mounted on the fourth wiring pattern 40 is configured such that the first short side a1 that is the first side of the fourth semiconductor chip Q4 is arranged along the oblique side 41 formed on the fourth wiring pattern 40, and the source electrode S of the fourth semiconductor chip Q4 is connected to the second wiring pattern 20 by way of the fourth connection member 84 such as an aluminum wire. The fourth connection member 84 extends from a side of the first short side a1 that is the first side of the fourth semiconductor chip Q4 orthogonal to the first short side a1, is connected to the second wiring pattern 20. In such a configuration, the fourth connection member 84 is also orthogonal to the second oblique side 22 of the second wiring pattern 20.

In this manner, the second semiconductor chip Q2 mounted on the third wiring pattern 30 is configured such that the first short side a1 (See FIG. 2) of the second semiconductor chip Q2 is arranged along the oblique side 31 formed on the third wiring pattern 30. Further, the fourth semiconductor chip Q4 mounted on the fourth wiring pattern 40 is configured such that the first short side a1 (see FIG. 2) of the fourth semiconductor chip Q4 is arranged along the oblique side 41 formed on the fourth wiring pattern 40. Accordingly, the second semiconductor chip Q2 and the fourth semiconductor chip Q4 do not adopt the parallel arrangement, and adopt the oblique arrangement.

In this embodiment, an angle made by the first oblique side 21 and the second oblique side 22 that the protruding portion 23 of the second wiring pattern 20 has (an internal angle at the apex point P) is set to 90 degrees. Accordingly, the second semiconductor chip Q2 is inclined by 45 degrees in a counterclockwise direction with respect to the center line C, and the fourth semiconductor chip Q4 is inclined by 45 degrees in a clockwise direction with respect to the center line C. In this manner, the second semiconductor chip Q2 and the fourth semiconductor chip Q4 are arranged such that these semiconductor chips Q2 and Q4 are not parallel to each other and a predetermined angle (45 degrees in this case) is made between the second semiconductor chip Q2 and the fourth semiconductor chip Q4. Hereinafter, there may be also a case where such arrangement is expressed in a simplified manner such as "the second semiconductor chip Q2 and the fourth semiconductor chip Q4 adopt the oblique arrangement".

On the other hand, the first semiconductor chip Q1 and the third semiconductor chip Q3 mounted on the first wiring pattern 10 are arranged parallel to each other with the recessed portion 12 sandwiched between the first semiconductor chip Q1 and the third semiconductor chip Q3. Accordingly, the first semiconductor chip Q1 and the third semiconductor chip Q3 adopt the parallel arrangement. The first semiconductor chip Q1 and the third semiconductor chip Q3 are arranged in a spaced apart manner such that the distance between the first semiconductor chip Q1 and the third semiconductor chip Q3 is a distance that is equal to or larger than at least an opening width of the recessed portion 12.

Further, as wiring patterns formed on the substrate 70, besides the wiring patterns 10 to 40 described above, first to fourth control wiring patterns 111 to 114 and first to fourth detection wiring patterns 121 to 124 exist.

The first to fourth control wiring patterns 111 to 114 are connected to the respective gate electrodes G of the semiconductor chips Q1 to 04 by way of connection members such as aluminum wires or the like respectively. These connection members are referred to as first to fourth control-use connection members 131 to 134. First to fourth control terminals T11 to T14 are connected to the first to fourth control wiring patterns 111 to 114. On the other hand, the first to fourth detection wiring patterns 121 to 124 are connected to the respective source electrodes S of the semiconductor chips Q1 to Q4 via connection members such as aluminum wires respectively. These connection members are referred to as first to fourth detection-use connection members 141 to 144. First to fourth detection terminals T21 to T24 are connected to the first to fourth detection wiring patterns 121 to 124.

Hereinafter, the description is made by taking the first semiconductor chip Q1 as an example. The first control wiring pattern 111 and the first detection 121 wiring pattern are formed corresponding to the gate electrodes G of the first semiconductor chip Q1. The first control-use connection member 131 is connected between the gate electrodes G of the first semiconductor chip Q1 and the first control wiring pattern 111. A first detection-use connection member 141 is connected between the source electrodes S of the first semiconductor chip Q1 and the first detection wiring pattern 121. The first control-use connection member 131 and the first detection-use connection member 141 are connected to the gate electrodes G and the source electrodes S of the semiconductor chip Q1 from the second short side a2 (see FIG. 2) side of the first semiconductor chip Q1.

The same goes for other semiconductor chips (second to fourth semiconductor chips Q2 to Q4). Corresponding to the second to fourth semiconductor chips Q2 to 04, the second to fourth control wiring patterns 112 to 114 and the second to fourth detection wiring patterns 122 to 124 are respectively formed. The second to fourth control-use connection members 132 to 134 are connected between the respective gate electrodes G of the second to fourth semiconductor chips Q2 to Q4 and the second to fourth control wiring patterns 112 to 114. The second to fourth detection-use connection members 142 to 144 are connected between the respective source electrodes S of the second to fourth semiconductor chips Q2 to Q4 and the second to fourth detection wiring patterns 122 to 124.

Also in the second to fourth semiconductor chips Q2 to Q4, the second to fourth control-use connection members 132 to 134 and the second to fourth control-use connection members 142 to 144 are connected to the respective gate electrodes G and the respective source electrodes S from sides of the respective second short sides a2 (see FIG. 2) of the second to fourth semiconductor chips Q2 to Q4.

In this manner, as illustrated in FIG. 2, the semiconductor chips Q1 to Q4 adopt the structure where the first to fourth connection members 81 to 84 are connected to the side of the first short side a1 that is the first side of the semiconductor chips Q1 to Q4, and the first to fourth control-use connection members 131 to 134 and the first to fourth detection-use connection members 141 to 144 are connected to the side of the second short side a2 on a side opposite to the first short side a1. The first to fourth connection members 81 to 84 are disposed so as to extend outward from the first short side a1 side of each of the semiconductor chips Q1 to Q4 and, further, the first to fourth control-use connection members 131 to 134 and the first to fourth detection-use connection members 141 to 144 are disposed so as to extend outward from the second short side a2 side of each of the semiconductor chips Q1 to Q4.

With the provision of such a structure, it is easy for the semiconductor chips Q1 to Q4 to ensure spaces for connecting the semiconductor chips Q1 to Q4 with the first to fourth connection members 81 to 84, the first to fourth control-use connection members 131 to 134 and the first to fourth detection-use connection members 141 to 144.

Figure 4:
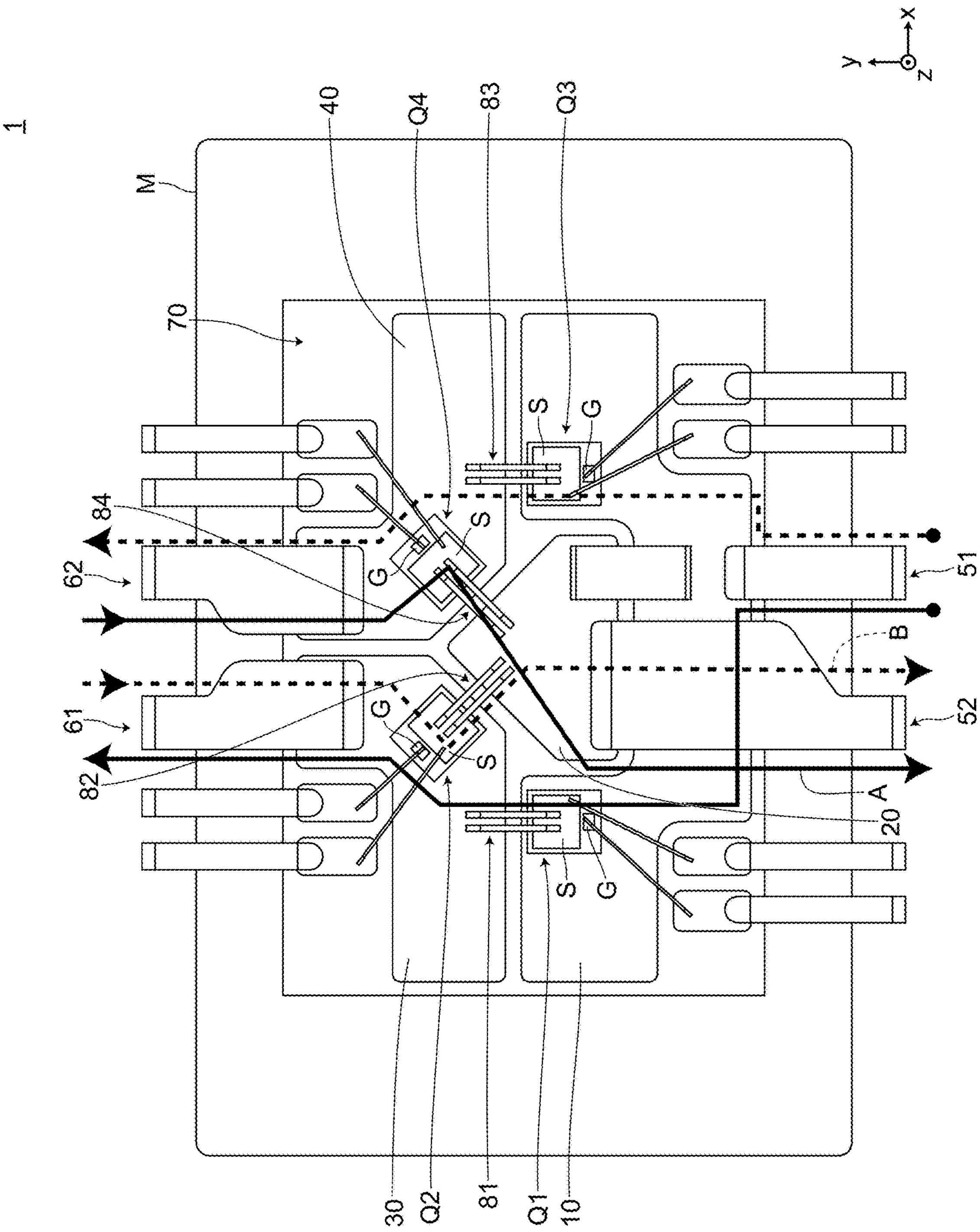
FIG. 4 is an explanatory view of a current paths of the semiconductor module 1 according to the embodiment.

Accordingly, even in a case where a plurality of wires (such as aluminum wires) are used as the first to fourth connection members 81 to 84 for connecting the respective source electrodes S of the semiconductor chips Q1 to Q4 and the wiring patterns 10 to 40, the wires having the same length respectively can be arranged in parallel in plane. In the semiconductor module 1 according to the embodiment 1, as illustrated in FIG. 1, FIG. 2 and FIG. 4, the case is described where two wires are used as the first to fourth connection members 81 to 84. However, even in a case where a larger number of connection members (for example, four connection members) are used as the first to fourth connection members 81 to 84, four wires having the same length can be arranged in parallel in plane. With such a configuration, wiring of the connection members can be made simple so that the wiring step can be simplified.

That is, the first connection member 81 extends from the side of the first short side a1 that is the first side of the first semiconductor chip Q1 orthogonal to the first side a1 of the first semiconductor chip Q1 and is connected to the third wiring pattern 30, and the second connection member 82 extends from the side of the first short side a1 that is the first side of the second semiconductor chip Q2 orthogonal to the first side a1 of the second semiconductor chip Q2 and is connected to the second wiring pattern 20. Further, the third connection member 83 extends from the side of the first short side a1 that is the first side of the third semiconductor chip Q3 orthogonal to the first side a1 of the third semiconductor chip Q3 and is connected to the fourth wiring pattern 40, and the fourth connection member 84 extends from the side of the first short side a1 that is the first side of the fourth semiconductor chip Q4 orthogonal to the first side a1 of the fourth semiconductor chip Q4 and is connected to the second wiring pattern 20.

The first to fourth connection members 81 to 84 are connected to the semiconductor chips Q1 to Q4 as described above. Accordingly, for example, in a case of connecting the first to fourth control-use connection members 131 to 134, the first to fourth detection-use connection members 141 to 144 and the like to the respective semiconductor chips Q1 to Q4, by extending these first to fourth control-use connection members 131 to 134, the first to fourth detection-use connection members 141 to 144 and the like from the sides (the second short sides a2) of the semiconductor chips Q1 to Q4 opposite to the first sides a1 of the semiconductor chips Q1 to Q4 toward the outside of the semiconductor chips Q1 to Q4, it becomes easy to ensure a space for connecting the first to fourth connection members 81 to 84, the first to fourth control-use connection members 131 to 134 and the first to fourth detection-use connection members 141 to 144. With such a configuration, in the case where the first to fourth connection members 81 to 84 are used in plurals as described above, the plurality of connection members can be arranged in parallel in plane and hence, wiring of the connection members can be made simple whereby it is possible to acquire an advantageous effect that the wiring step can be simplified.

Subsequently, the first and second power source terminals 51, 52 and the first and second intermediate point terminals 61, 62 are described. The first power source terminal 51 and the second power source terminal 52 are terminals for supplying electricity to the bridge circuit. In a case where the supply of electricity is considered as the flow of a current, the first power source terminal 51 functions as an input side of the current and the second power source terminal 52 functions as an output side of the current.

The first power source terminal 51 is connected to the first wiring pattern 10. The second power source terminal 52 is connected to the second wiring pattern 20 while straddling over the first wiring pattern 10 in a non-contact manner. These first power source terminal 51 and the second power source terminal 52 are disposed adjacently to each other. A decoupling capacitor 90 is disposed on an extension of the first power source terminal 51 along the y axis, and one end of the decoupling capacitor 90 is connected to the first wiring pattern 10, and the other end of the decoupling capacitor 90 is connected to the second wiring pattern 20. The decoupling capacitor 90 has a function of avoiding the fluctuation of a power source voltage and of removing various noises.

On the other hand, the first intermediate point terminal 61 and the second intermediate point terminal 62 are terminals to which a load not illustrated in the drawing is connected. The first intermediate point terminal 61 is connected to the third wiring pattern 30, and the second intermediate point terminal 62 is connected to the fourth wiring pattern 40. These first intermediate point terminal 61 and second intermediate point terminal 62 are disposed adjacently to each other. In such a configuration, the directions of currents that flow with respect to the first intermediate point terminal 61 and the second intermediate point terminal 62 become opposite (are inverted) between when both the first semiconductor chip Q1 and the fourth semiconductor chip Q4 are turned on and when both the third semiconductor chip Q3 and the second semiconductor chip Q2 are turned on.

In the semiconductor module 1 according to the embodiment, when both the first semiconductor chip Q1 and the fourth semiconductor chip Q4 are turned on, a current flows from the first intermediate point terminal 61 to the second intermediate point terminal 62. On the other hand, when both the third semiconductor chip Q3 and the second semiconductor chip Q2 are turned on, a current flows from the second intermediate point terminal 62 to the first intermediate point terminal 61. The overall current path in the semiconductor module 1 according to the embodiment is described later.

Further, the first and second power source terminals 51, 52 and the first and second intermediate point terminals 61, 62 are arranged on opposite sides of the semiconductor module 1 in a state where the second wiring pattern 20 is sandwiched between the first and the second power source terminals 51, 52 and the first and second intermediate point terminals 61, 62. That is, as illustrated in FIG. 1, the first source terminal 51 and the second power source terminal 52, and the first intermediate point terminal 61 and the second intermediate point terminal 62 are disposed so as to be positioned on opposite sides of the semiconductor module 1 in a state where the outer lead portion 51*b* of the first power source terminal 51 and the outer lead portion 52*b* of the second power source terminal 52, and the outer lead portion 61*b* of the first intermediate point terminal 61 and the outer lead portion 62*b* of the second intermediate point terminal 62 sandwich the second wiring pattern 20 therebetween.

In the above-mentioned configuration, "opposite sides of the semiconductor module 1" means, to take the case illustrated in FIG. 1 as an example, an upper side and a lower side of the semiconductor module 1 illustrated in the drawing. Further, the outer lead portion means a portion that exists outside a resin when resin sealing is applied, and an inner lead portion means a portion that exists inside the resin. Although the semiconductor module 1 according to the embodiment 1 is sealed by a resin, in FIG. 1, to illustrate the internal configuration of the semiconductor module 1, with respect to the resin, only an outer edge of the resin is indicated by a symbol M. The same goes for configurations illustrated in FIG. 4 to FIG. 6 described later.

An inner lead portion of at least one terminal of the first power source terminal 51, the second power source terminal 52, the first intermediate point terminal 61 and the second intermediate point terminal 62 has a large width compared to the inner lead portions of other terminals (for example, the first to fourth control terminal T11 to T14, the first to fourth detection terminals T21 to T24 and the like) that are formed on the semiconductor module 1 according to the embodiment.

In the semiconductor module 1 according to the embodiment, an inner lead portion 52*a* of the second power source terminal 52 and the inner lead portions 61*a*, 62*a* of the first and second intermediate portion terminals 61, 62 have a large width. In such a configuration, "width" means a length of each terminal in a direction orthogonal to an extending direction of the terminal. For example, to take the second power source terminal 52 as an example, the extending direction of the second power source terminal 52 is the direction along the y axis illustrated in the drawing and hence, a length in the direction along the x axis orthogonal to the extending direction (the direction along the y axis) is set as "width".

A width (referred to as the width W1 hereinafter) of the inner lead portion 52*a* of the second power source terminal 52 is substantially two times to four times as large as a width of the first power source terminal 51, and widths of the first to fourth control terminals T11 to T14 and the first to fourth detection terminals T21 to T24. The second power source terminal 52 is connected to a portion of the second wiring pattern 20 close to a lower side 24 of the second wiring pattern 20, and the width W1 of the inner lead portion 52*a* of the second power source terminal 52 occupies a range where the width W1 is ½ or slightly larger than ½ of a length of the second wiring pattern 20 in a direction along the lower side 24 of the second wiring pattern 20 (direction along the x axis). The width W1 of the inner lead portion 52*a* of the second power source terminal is set such that it is possible to ensure an arrangement space of the decoupling capacitor 90 that is connected between the first wiring pattern 10 and the second wiring pattern 20. In this embodiment, the width W1 of the inner lead portion 52*a* of the second power source terminal 52 is set large compare to the widths of other terminals. However, when the space has still a margin, the width of the first power source terminal 51 can be also made large.

Further, the respective inner lead portions 61*a*, 62*a* of the first intermediate point terminal 61 and the second intermediate point terminal 62 also have a large width compare to other terminals (for example, the first to fourth control terminals T11 to T14, the first to fourth detection terminals T21 to T24 and the like). In the semiconductor module 1 according to the embodiment, a width W2 (see FIG. 2) of the first intermediate point terminal 61 and a width W3 (see FIG. 2) of the second intermediate point terminal 62 are set substantially two to three times as large as the widths of the first to fourth control terminals T11 to T14 and the widths of the first to four detection terminals T21 to T24. However, when the space has still a margin, the width W2 of the first intermediate point terminal 61 and the width W3 of the second intermediate point terminal 62 can be made larger.

Figure 3:
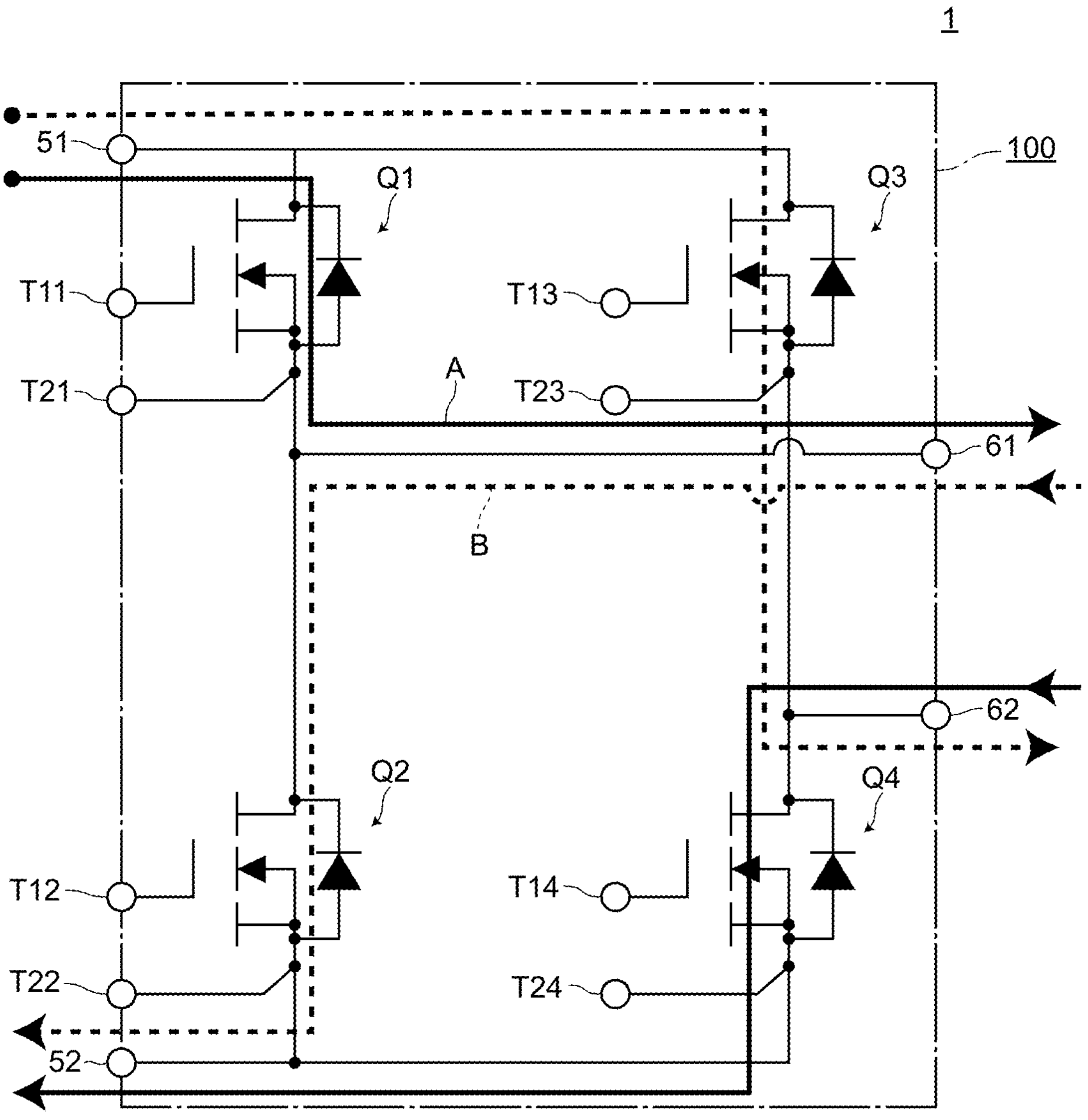
FIG. 3 is an equivalent circuit diagram of a bridge circuit of the semiconductor module 1 illustrated in FIG. 1.

FIG. 3 is an equivalent circuit diagram of the bridge circuit of the semiconductor module 1 illustrated in FIG. 1. In FIG. 3, the constitutional elements identical to the constitutional elements illustrated in FIG. 1 are given the same symbols. The bridge circuit 100 illustrated in FIG. 3 is, as described previously, the bridge circuit where the first semiconductor Q1 chip and the third semiconductor chip Q3 form the high side, and the second semiconductor chip Q2 and the fourth semiconductor chip Q4 form the low side.

In such a bridge circuit 100, by applying a predetermined voltage to the respective gate electrodes G of the first semiconductor chip Q1 and the fourth semiconductor chip Q4, both the first semiconductor chip Q1 and the fourth semiconductor chip Q4 are turned on. Further, by applying a predetermined voltage to the respective gate electrodes G of the third semiconductor chip Q3 and the second semiconductor chip Q2, both the third semiconductor chip Q3 and the second semiconductor chip Q2 are turned on.

In such a bridge circuit 100, a current path when both the first semiconductor chip Q1 and the fourth semiconductor chip Q4 are turned on is, as indicated by a solid line A in FIG. 3, a path where a current flows from the first power source terminal 51, flows through the first semiconductor chip Q1 and reaches the first intermediate point terminal 61 and, after flowing through a load not illustrated in the drawing from the first intermediate point terminal 61, flows from the second intermediate point terminal 62, through flows the fourth semiconductor chip Q4 and reaches the second power source terminal 52.

On the other hand, a current path when both the third semiconductor chip Q3 and the second semiconductor chip Q2 are turned on is, as indicated by a broken line B in FIG. 3, a path where a current flows from the first power source terminal 51, flows through the third semiconductor chip Q3 and reaches the second intermediate point terminal 62 and, after flowing through a load not illustrated in the drawing from the second intermediate point terminal 62, flows from the first intermediate point terminal 61, flows through the second semiconductor chip Q2 and reaches the second power source terminal 52.

Such current paths are described specifically with reference to FIG. 4. FIG. 4 is a view illustrating the configuration of the semiconductor module obtained by adding the current paths to the semiconductor module 1 illustrated in FIG. 1. Accordingly, the semiconductor module 1 illustrated in FIG. 4 has substantially the same configuration as the semiconductor module 1 illustrated in FIG. 1. However, in FIG. 4, with respect to the symbols indicating the respective constitutional elements illustrated in FIG. 1 and FIG. 2, some symbols are omitted, and mainly, the symbols of the constitutional elements necessary for the description of the current paths are described.

The current path when both the first semiconductor chip Q1 and the fourth semiconductor chip Q4 are turned on forms a path indicated by a solid line A in FIG. 4. Specifically, a current from the first power source terminal 51 enters the first wiring pattern 10, and flows from the drain electrode D (not illustrated in the drawing) of the first semiconductor chip Q1 mounted on the first wiring pattern 10 and through the source electrode S of the first semiconductor chip Q1, and flows to the first intermediate point terminal 61 through the third wiring pattern 30 via the first connection member 81 that connects the source electrode S and the third wiring pattern 30. Then, the current enters the fourth wiring pattern 40 from the second intermediate point terminal 62 via the load not illustrated in the drawing, and flows from the drain electrode D (not illustrated in the drawing) of the fourth semiconductor chip Q4 mounted on the fourth wiring pattern 40 to the source electrode S of the fourth semiconductor chip Q4, and flows to the second power source terminal 52 through the second wiring pattern 20 via the fourth connection member 84 that connects the source electrode S and the second wiring pattern 20 to each other.

On the other hand, the current path when both the third semiconductor chip Q3 and the second semiconductor chip Q2 are turned on forms a path indicated by a broken line B in FIG. 4. Specifically, a current from the first power source terminal 51 enters the first wiring pattern 10, and flows from the drain electrode D (not illustrated in the drawing) of the third semiconductor chip Q3 mounted on the first wiring pattern 10 and through the source electrode S of the third semiconductor chip Q3 and flows to the second intermediate point terminal 62 through the fourth wiring pattern 40 via the third connection member 83 that connects the source electrode S and the fourth wiring pattern 40. Then, the current enters the third wiring pattern 30 from the first intermediate point terminal 61 via the load not illustrated in the drawing, and flows from the drain electrode D (not illustrated in the drawing) of the second semiconductor chip Q2 mounted on the third wiring pattern 30 and through the source electrode S of the second semiconductor chip Q2, and flows to the second power source terminal 52 through the second wiring pattern 20 from the second connection member 82 that connects the source electrode S and the second wiring pattern 20.

In this manner, the current path when both the first semiconductor chip Q1 and the fourth semiconductor chip Q4 are turned on and the current path when both the third semiconductor chip Q3 and the second semiconductor chip Q2 are turned on can be shortened as indicated by the solid line A and the broken line B in FIG. 4. Such formation of the current paths is set by taking into account the arrangement of the wiring patterns 10 to 40, the arrangement of the semiconductor chips Q1 to Q4, the arrangement of the first and second power source terminals 51, 52, and the first and second intermediate point terminals 61, 62.

That is, in the recessed portion 12 formed in the first wiring pattern 10, the second wiring pattern 20 that includes the protruding portion 23 having a tapered shape is disposed, and the second wiring pattern 20 functions as a current path from the first intermediate point terminal 61 or the second intermediate point terminal 62 to the second power source terminal 52. Further, as described previously, the first semiconductor chip Q1 and the third semiconductor chip Q3 sandwich the recessed portion 12 formed in the first wiring pattern 10, and are disposed adjacently to the recessed portion 12. Further, the second semiconductor chip Q2 is obliquely arranged so as to follow the oblique side 31 of the third wiring pattern 30, and the fourth semiconductor chip Q4 is obliquely arranged so as to follow the oblique side 41 of the fourth wiring pattern 40.

With such a configuration, a current path is formed where a current flows from the second intermediate point terminal 62 and reaches the second power source terminal 52 when both the first semiconductor chip Q1 and the fourth semiconductor chip Q4 are turned on, and a current path is formed where a current flows from the first intermediate point terminal 61 and reaches the second power source terminal 52 when both the third semiconductor chip Q3 and the second semiconductor chip Q2 are turned on. As illustrated by a solid line A and a broken line B in FIG. 4, both current paths become paths that obliquely pass the second wiring pattern 20 via the second semiconductor chip Q2 and the fourth semiconductor chip Q4 that are both obliquely arranged, and reach the second power source terminal 52 that is connected to the second wiring pattern 20.

Accordingly, in both the current path that reaches the second power source terminal 52 from the first intermediate point terminal 61 and the current path that reaches the second power source terminal 52 from the second intermediate point terminal 62, currents flow more straightly without being bent largely and hence, the current paths can be shortened whereby a parasitic inductance can be reduced.

The first and second power source terminals 51, 52 are disposed adjacently to each other, and the first and second intermediate point terminals 61, 62 are also disposed adjacently to each other. Further, the first and second power source terminals 51, 52 and the first and second intermediate point terminals 61, 62 are disposed on opposite sides of the semiconductor module 1 with the second wiring pattern 20 sandwiched therebetween, that is, are disposed on an upper side and a lower side of the semiconductor module 1 along the y axis in FIG. 1.

By arranging the first and second power source terminals 51, 52 and the first and second intermediate point terminals 61, 62 in this manner, in the semiconductor module 1 according to the embodiment, the current paths of the entire bridge circuit where a current flows from the first power source terminal 51 and reaches the second power source terminal 52 when both the first semiconductor chip Q1 and the fourth semiconductor chip Q4 are turned on, and the current paths of the entire bridge circuit where a current flows from the first power source terminal 51 and reaches the second power source terminal 52 when both the third semiconductor chip Q3 and the second semiconductor chip Q2 are turned on are, as indicated by the solid line A and the broken line B in FIG. 4, mainly formed on the second wiring pattern 20 and a surrounding of the second wiring pattern 20. With such a configuration, a total length of the current paths of entire bridge circuit can be shortened and hence, a parasitic inductance can be reduced further effectively.

The first and second power source terminals 51, 52 are disposed adjacently to each other, and the first and second intermediate point terminals 61, 62 are also disposed adjacently to each other. Accordingly, in both the case where an operation of turning on both the first semiconductor chip Q1 and the fourth semiconductor chip Q4 is performed and the case where an operation of turning on both the third semiconductor Q3 chip and the second semiconductor chip Q2 is performed, the directions of the currents that flow in the first intermediate point terminal 61 and the second intermediate point terminal 62 that are disposed adjacently to each other respectively become the directions opposite to each other. Accordingly, it is possible to make a magnetic field generated in the first intermediate point terminal 61 and a magnetic field generated in the second intermediate point terminal 62 cancel each other. Accordingly, it is possible to reduce the parasitic inductance also from this aspect.

For example, with respect to the current paths (solid lines A) at the first intermediate point terminal 61 and at the second intermediate point terminal 62 when both the first semiconductor chip Q1 and the fourth semiconductor chip Q4 are turned on, as illustrated in FIG. 4, the current path is directed in an upward direction along the y axis in FIG. 1 at the first intermediate point terminal 61, and the current path is directed in a downward direction along the y axis in FIG. 1 at the second intermediate point terminal 62. In this manner, the directions of the currents that flow through the first intermediate point terminal 61 and the second intermediate point terminal 62 that are disposed adjacently to each other become directions opposite to each other. Accordingly, it is possible to make a magnetic field generated at the first intermediate point terminal 61 and a magnetic field generated at the second intermediate point terminal 62 cancel each other and hence, a parasitic inductance can be reduced.

On the other hand, with respect to the current paths (broken lines B) at the first intermediate point terminal 61 and at the second intermediate point terminal 62 when both the third semiconductor chip Q3 and the second semiconductor chip Q2 are turned on, as illustrated in FIG. 4, the current path is directed in a downward direction along the y axis in FIG. 1 at the first intermediate point terminal 61, and the current path is directed in an upward direction along the y axis at the second intermediate point terminal 62. In this manner, the directions of the currents that flow through the first intermediate point terminal 61 and the second intermediate point terminal 62 that are disposed adjacently to each other become directions opposite to each other. Accordingly, also in this case, it is possible to make a magnetic field generated at the first intermediate point terminal 61 and a magnetic field generated at the second intermediate point terminal 62 cancel each other and hence, a parasitic inductance can be reduced.

An advantageous effect that the magnetic fields are cancelled with each other by making the directions of the flowing currents become opposite directions so that a parasitic inductance reducing effect can be expected exists also between the first power source terminal 51 and the second power source terminal 52 that are disposed adjacently to each other.

In this manner, in the semiconductor module 1 according to the embodiment, it is possible to acquire an advantageous effect that a parasitic inductance can be reduced. Further, it is possible to suppress the thermal interference between the semiconductor chips in addition to the advantageous effect of reducing a parasitic inductance.

That is, in the semiconductor module 1 according to the embodiment, the first semiconductor chip Q1 and the third semiconductor chip Q3 are mounted on the first wiring pattern 10 in a state where the first semiconductor chip Q1 and the third semiconductor chip Q3 sandwich the recessed portion 12 formed in the first wiring pattern 10 (see FIG. 1 and FIG. 2). Further, the second semiconductor chip Q2 is disposed so as to follow the oblique side 31 of the third wiring pattern 30, and the fourth semiconductor chip Q4 is disposed so as to follow the oblique side 41 of the fourth wiring pattern 40 (see FIG. 1 and FIG. 2).

With such a configuration, the semiconductor chips Q1 to Q4 are disposed while keeping predetermined distances therebetween respectively and hence, it is possible to suppress the thermal interference between the semiconductor chips.

Particularly, with respect to the second semiconductor chip Q2 and the fourth semiconductor chip Q4, the semiconductor chip Q2 and the fourth semiconductor chip Q4 are obliquely disposed. Accordingly, it is possible to easily dissipate heat that the second and fourth semiconductor chips Q2, Q4 generate and hence, it is possible to suppress the thermal interference between the second and fourth semiconductor chips Q2, Q4.

Figure 10:
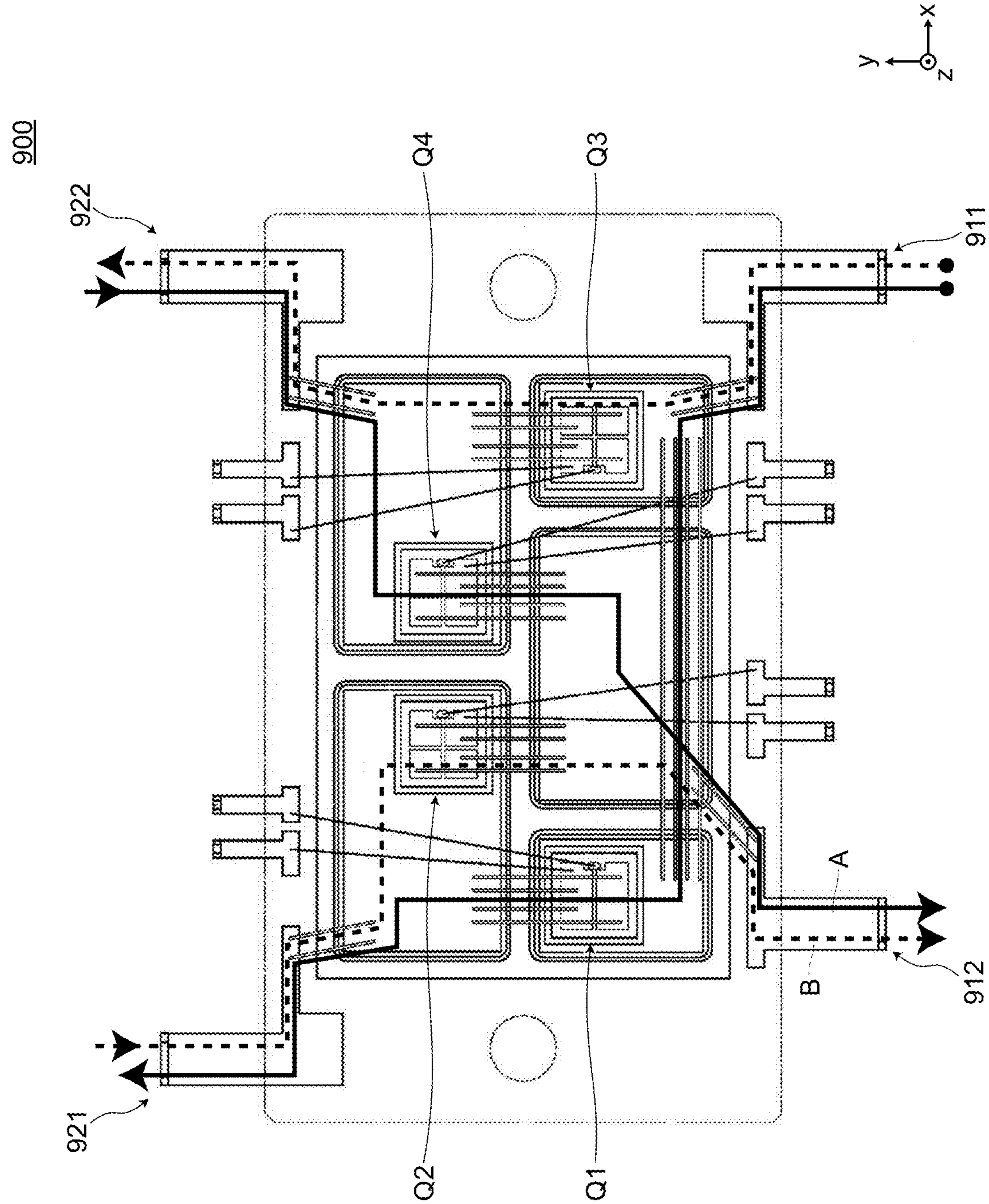
FIG. 10 is a plan view of the internal configuration of a semiconductor device 900 described in patent literature 1.

On the other hand, for example, when the second semiconductor chip Q2 and the fourth semiconductor chip Q4 are disposed adjacently to each other and are arranged parallel to each other as in the case of the semiconductor device 900 (see FIG. 10) that is disclosed in patent literature 1, it is difficult to dissipate heat that the second and fourth semiconductor chips Q2, Q4 generate. Thus, giving rise to the drawback that the heats of the second and fourth semiconductor chips Q2, Q4 interfere with each other. According to the semiconductor module 1 of the embodiment, such a drawback can be improved.

As has been described heretofore, according to the semiconductor module 1 of the embodiment, it is possible to acquire an advantageous effect that a parasitic inductance can be reduced, and an advantageous effect that the interference of heats between the semiconductor elements can be reduced. To verify these advantageous effects, the inventors carried out a simulation. Hereinafter, a result of the simulation that the inventors carried out is described.

Figure 5:
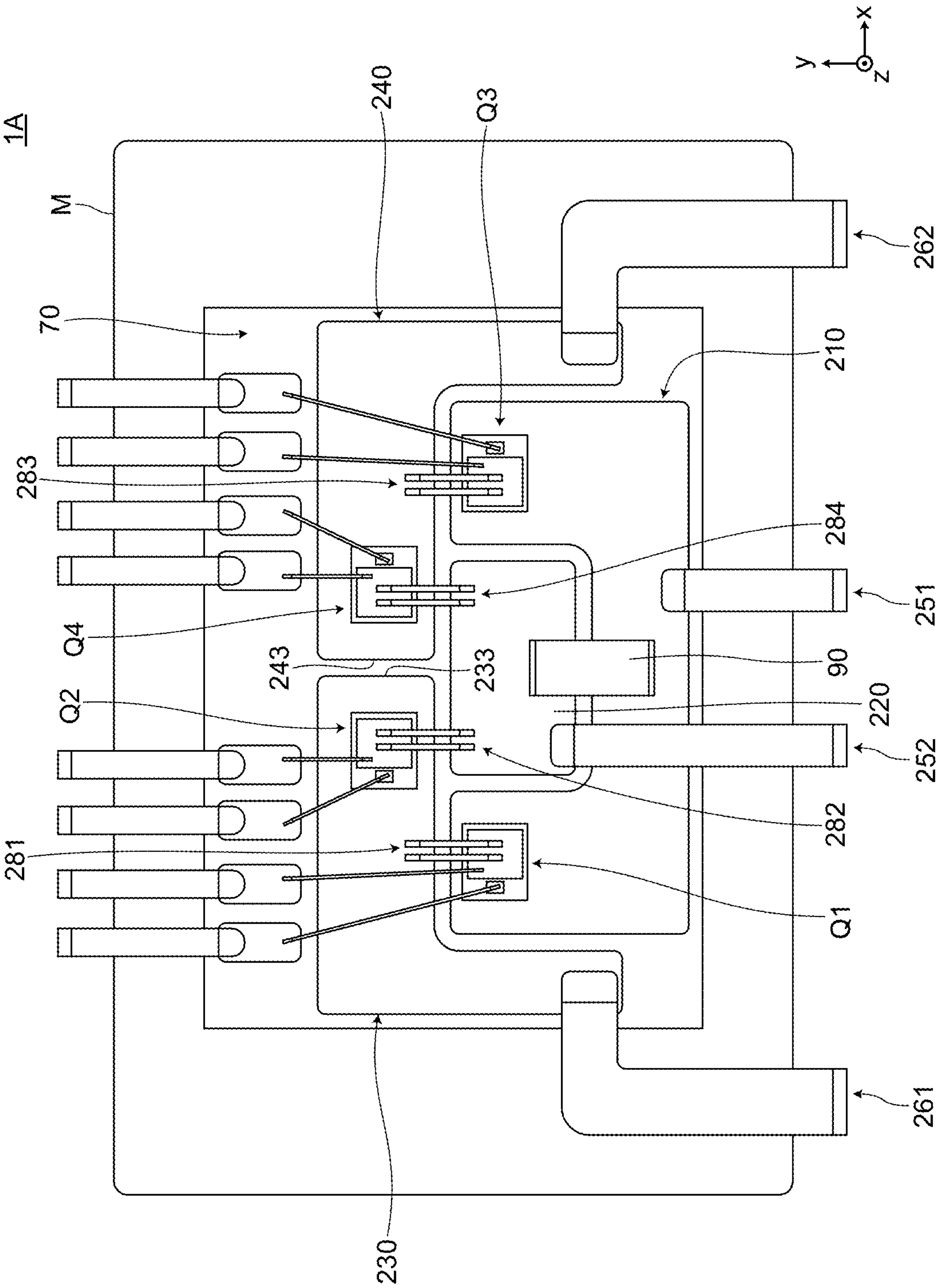
FIG. 5 is a plan view of the internal configuration of a semiconductor module 1A prepared for comparison with the semiconductor module 1 according to the embodiment.

FIG. 5 is a view illustrating the configuration of a semiconductor module 1A prepared for a comparison with the semiconductor module 1 according to the embodiment. In the description made hereinafter, the semiconductor module 1A prepared for a comparison with the semiconductor module 1 according to the embodiment may also simply expressed as "semiconductor module 1A".

The semiconductor module 1A basically has substantially the same constitutional elements as the semiconductor module 1 according to the embodiment. In FIG. 5, with respect to the symbols indicating the constitutional elements of the semiconductor module 1A, the symbols necessary for the description are indicated. In the semiconductor module 1A, first to fourth wiring patterns 210 to 240 correspond to the first to fourth wiring patterns 10 to 40 in the semiconductor module 1 according to the embodiment, first and second power source terminals 251, 252 correspond to the first and second power source terminals 51, 52 in the semiconductor module 1 according to the embodiment, first and second intermediate point terminals 261, 262 correspond to the first and second intermediate point terminals 61, 62 in the semiconductor module 1 according to the embodiment, and first to fourth connection members 281 to 284 correspond the first to fourth connection members 81 to 84 in the semiconductor module 1 according to the embodiment.

In the semiconductor module 1 according to the embodiment, the first to fourth semiconductor chips Q1 to Q4 are used as the first to fourth semiconductor chips Q1 to Q4 also in the semiconductor module 1A, and the substrate 70 in the semiconductor module 1 according to the embodiment is also used as the substrate 70 in the semiconductor module 1A. Further, also in such a configuration, in a case where the first to fourth semiconductor chips Q1 to Q4 are collectively described, these semiconductor chips Q1 to Q4 may be expressed as the semiconductor chips Q1 to Q4, and in a case where the first to fourth wiring patterns 210 to 240 are collectively described, these wiring patterns 210 to 240 may be also expressed as the wiring patterns 210 to 240.

The bridge circuit of the semiconductor module 1A has substantially the same configuration as the semiconductor module 1 according to the embodiment. That is, the bridge circuit of the semiconductor module 1A is a bridge circuit where the first semiconductor chip Q1 and the third semiconductor chip Q3 are disposed on a high side and the second semiconductor chip Q2 and the fourth semiconductor chip Q4 are disposed on a low side, wherein both the first semiconductor chip Q1 and the fourth semiconductor chip Q4 are turned on, and both the third semiconductor chip Q3 and the second semiconductor chip Q2 are turned on.

In the semiconductor module 1A, in the same manner as the semiconductor module 1 according to the embodiment, the recessed portion (a recessed portion 212) is formed in the first wiring pattern 210, and the second wiring pattern 220 is disposed so as to be surrounded by the recessed portion 212 from three directions. In the semiconductor module 1A, the second wiring pattern 220 does not have the protruding portion 23 having a tapered shape illustrated in FIG. 1, and is formed in a rectangular shape (see FIG. 5). Accordingly, the second semiconductor chip Q2 mounted on the third wiring pattern 230 and the fourth semiconductor chip Q4 mounted on the fourth wring pattern 240 are disposed parallel to each other and are disposed adjacently to each other. The semiconductor module 1A largely differs from the semiconductor module 1 according to the embodiment with respect to this point.

Further, in the semiconductor module 1A, in the same manner as the semiconductor module 1 according to the embodiment, the first power source terminal 251 is connected to the first wiring pattern 210, the second power source terminal 252 is connected to the second wiring pattern 220 while straddling over the first wiring pattern 210 in a non-contact manner. Further, the first intermediate point terminal 261 is connected to the third wiring pattern 230, and the second intermediate point terminal 262 is connected to the fourth wring pattern 240.

However, in the semiconductor module 1A, the first intermediate point terminal 261 and the second intermediate point terminal 262 are not disposed adjacently to each other, are disposed at the both end portions (a left end portion and a right end portion) of the substrate 70 in a spaced-apart manner, the first power source terminal 251 and the second power source terminal 252 are disposed on the substrate 70 at the same side. Further, widths of the first and second power source terminals 251, 252 and widths of the first and second intermediate point terminals 261, 262 are not particularly set wide compared to other terminals. The semiconductor module 1A also differs from the semiconductor module 1 according to the embodiment in view of these points.

Further, in the semiconductor module 1A, the first semiconductor chip Q1 is connected to the third wiring pattern 230 via the first connection member 281, the second semiconductor chip Q2 is connected to the second wiring pattern 220 via the second connection member 282, the third semiconductor chip Q3 is connected to the fourth wiring pattern 240 via the third connection member 283, the fourth semiconductor chip Q4 is connected to the second wiring pattern 220 via the fourth connection member 284.

Figure 6:
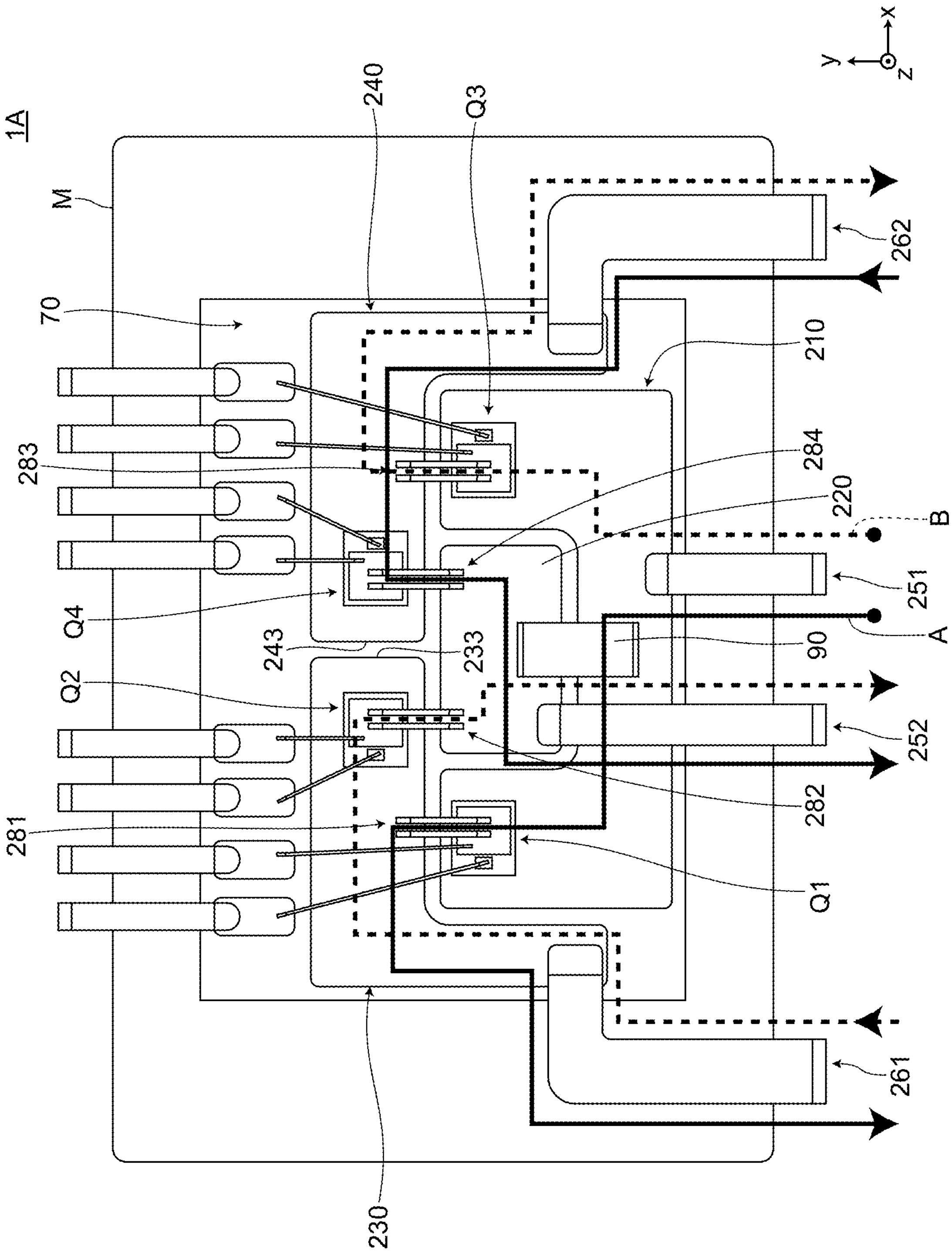
FIG. 6 is an explanatory view of current paths of the semiconductor module 1A prepared for the comparison.

FIG. 6 is a view describing current paths of the semiconductor module 1A prepared for comparison. FIG. 6 is a view illustrating the configuration of the semiconductor module 1A obtained by adding the current paths to the semiconductor module 1A illustrated in FIG. 5. Accordingly, the semiconductor module 1A illustrated in FIG. 6 has substantially the same configuration as the semiconductor module 1A illustrated in FIG. 5. As illustrated in FIG. 6, the current paths of the semiconductor module 1A become paths indicated by a solid line A in FIG. 6 when both the first semiconductor chip Q1 and the fourth semiconductor chip Q4 are turned on. The current paths of the semiconductor module 1A become paths indicated by a broken line B in FIG. 6 when both the third semiconductor chip Q3 and the second semiconductor chip Q2 are turned on.

As illustrated in FIG. 6, in the semiconductor module 1A, the current paths (solid line A) when both the first semiconductor chip Q1 and the fourth semiconductor chip Q4 are turned on, and the current paths (broken line B) when both the third semiconductor chip Q3 and the second semiconductor chip Q2 are turned on become longer compared to the corresponding current paths in both cases in the semiconductor module 1 according to the embodiment. Accordingly, such configuration gives rise to a drawback that a parasitic inductance is generated.

Hereinafter, the description is made with respect to a result obtained by comparing, by simulation, a parasitic inductance generated in the semiconductor module 1 according to the embodiment and a parasitic inductance generated in the semiconductor module 1A. Here, assuming frequency of a turn on/off operation of the bridge circuit as 100 kHz, a parasitic inductance that was generated in the current paths when the first semiconductor chip Q1 and the fourth semiconductor chip Q4 were turned on, and a parasitic inductance that was generated in the current paths when the third semiconductor chip Q3 and the second semiconductor chip Q2 were turned on are measured.

FIG. 7 is a table illustrating a measurement result of the parasitic inductance generated in the semiconductor module 1 according to the embodiment and the parasitic inductance generated in the semiconductor module 1A. In FIG. 7, the semiconductor module according to the embodiment is expressed as "semiconductor module 1". Further, current paths indicated by solid line A in FIG. 4 and FIG. 6 are expressed as "current paths A", the current paths indicated by broken line B are expressed as "current paths B".

As illustrated in FIG. 7, in the semiconductor module 1A, a parasitic inductance that was generated in the current path A when both the first semiconductor chip Q1 and the fourth semiconductor chip Q4 were turned on (see FIG. 6) was 48.4 nanohenry (48.4 nH), and a parasitic inductance that was generated in the current path B when both the third semiconductor chip Q3 and the second semiconductor chip Q2 were turned on (see FIG. 6) was 36.3 nanohenry (36.3 nH).

On the other hand, in the semiconductor module 1 according to the embodiment, a parasitic inductance that was generated in the current path A when both the first semiconductor chip Q1 and the fourth semiconductor chip Q4 were turned on (see FIG. 4) was 20.6 nanohenry (20.6 nH), and a parasitic inductance that was generated in the current path B when both the third semiconductor chip Q3 and the second semiconductor chip Q2 were turned on (see FIG. 4) was 19.2 nanohenry (19.2 nH).

It was confirmed from this result that the semiconductor module 1 according to the embodiment can largely reduce a parasitic inductance compared to the semiconductor module 1A in both the case where the first semiconductor chip Q1 and the fourth semiconductor chip Q4 are turned on and the case where both the third semiconductor chip Q3 and the second semiconductor chip Q2 are turned on.

Further, in the semiconductor module 1A, in addition to the problem relating to a parasitic inductance, the interference of heats of the semiconductor chips also gives rise to a problem. Particularly, in the semiconductor module 1A, the interference of heats of the second and fourth semiconductor chips Q2, Q4 gives rise to a drawback. This is because that, in the semiconductor module 1A, the second semiconductor chip Q2 and the fourth semiconductor chip Q4 are disposed parallel to each other and are disposed adjacently to each other and hence, it is difficult for the second semiconductor chip Q2 and the fourth semiconductor chip Q4 to dissipate the heats that these semiconductor chips generate and hence, the interference of heats is liable to be easily generated between the second semiconductor chip Q2 and fourth semiconductor chips Q4.

Figure 8A:
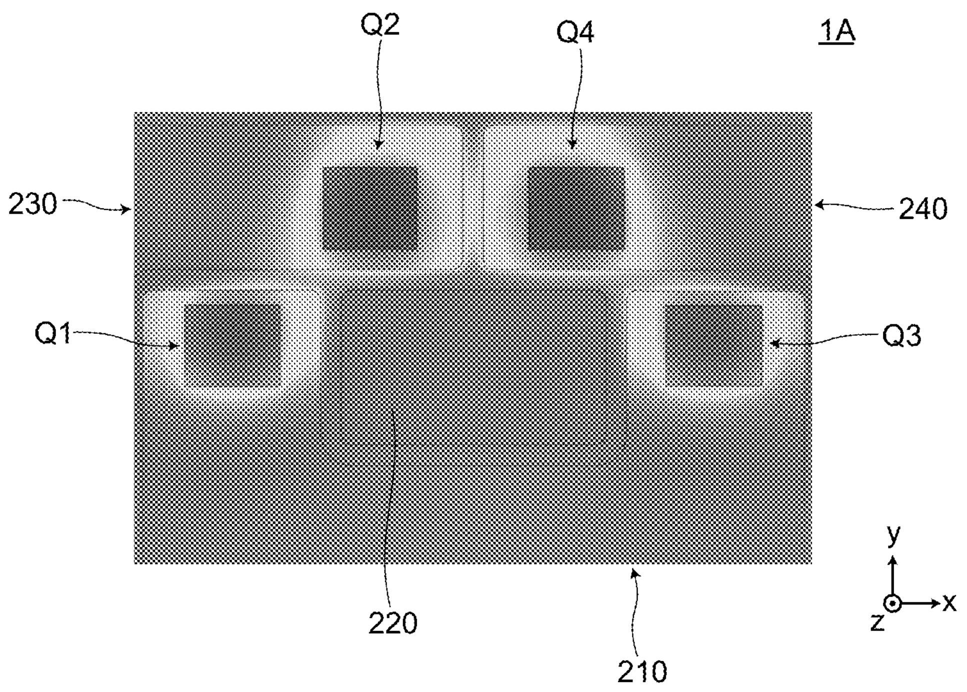
FIG. 8A and FIG. 8B are views illustrating a mode of temperature due to heat generated by semiconductor chips Q1 to Q4 mounted on a semiconductor module 1 according to the embodiment and a mode of temperature due to heat generated by semiconductor chips Q1 to Q4 mounted on a semiconductor module 1A.
Figure 8B:
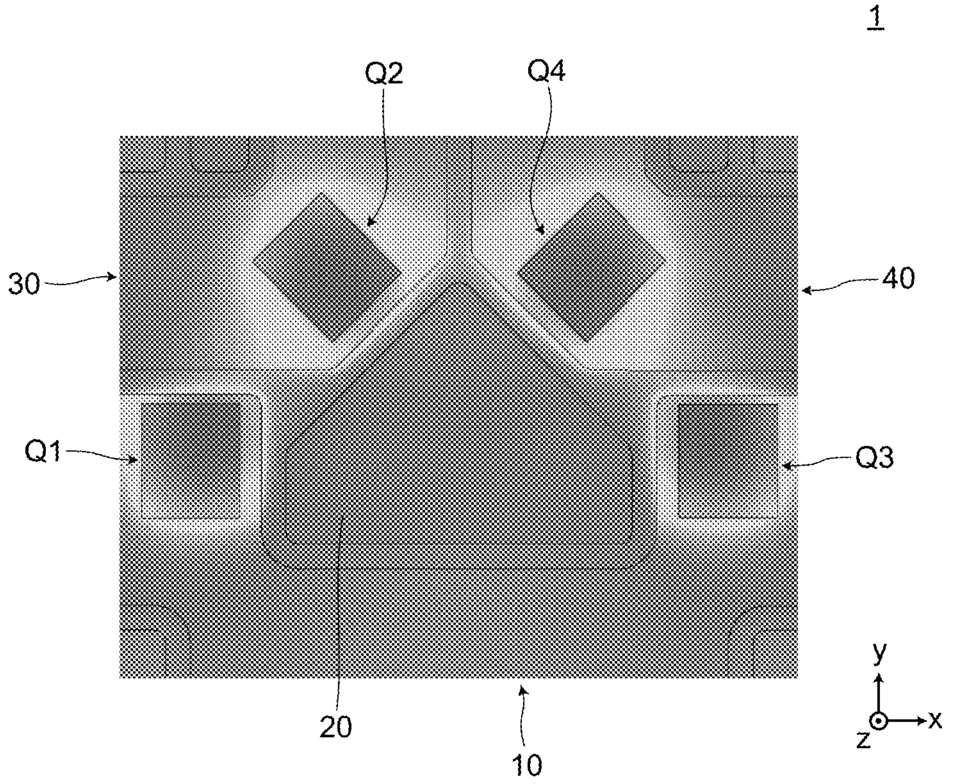

FIG. 8A and FIG. 8B are views illustrating a mode of temperatures due to heats generated by the semiconductor chips Q1 to 04 mounted on the semiconductor module 1A and the semiconductor module 1 according to the embodiment. FIG. 8A indicates the mode of temperature of the semiconductor module 1A, and the FIG. 8B indicates the mode of temperature of the semiconductor module 1 according to the embodiment.

In FIG. 8A and FIG. 8B, with respect to the semiconductor module 1 illustrated in FIG. 1 and the semiconductor module 1A illustrated in FIG. 5, the first to fourth semiconductor chips Q1 to Q4 and the surroundings thereof are illustrated in an enlarged manner. Accordingly, in FIG. 8A and FIG. 8B, only main parts such as the first to fourth semiconductor chips Q1 to Q4 and the first to fourth wiring patterns 10 to 40 are illustrated, and the illustration of other constitutional members is omitted. Further, in FIG. 8A and FIG. 8B, out of the symbols that indicate the respective constitutional elements illustrated in FIG. 1, FIG. 2 and FIG. 5, only symbols that indicate the main parts are indicated.

FIG. 8A and FIG. 8B are monochromic drawings and hence, the temperatures due to heats that the semiconductor chips Q1 to Q4 generate cannot be indicated in color. However, on a color screen that is an original of FIG. 8A and FIG. 8B, temperatures due to the heats that the semiconductor chips Q1 to Q4 generate are indicated in color. That is, a change in temperature is expressed as color gradation from cold colors to warm colors on the color screen. Specifically, the temperature is expressed in gradation where blue color indicates that the temperature is low, and color is changed to green color, yellow color, brown color and red color sequentially as the temperature is increased on the color screen. Darker shaded regions centered on insides of the semiconductor chips Q1 to Q4 in FIG. 8A and FIG. 8B express regions with higher temperature, where on the color screen the colors are changed from red color to brown color in gradation. Darker shaded regions in FIG. 8A are much darker than darker shaded regions in FIG. 8B. This difference in shading is due to the fact that the darker shaded regions in FIG. 8A are regions of mainly red color on the color screen, and the darker shaded regions in FIG. 8B are regions of mainly brown color on the color screen. Lighter shaded regions surrounding the darker shaded regions express regions with slightly higher temperature, where on the color screen the colors are mainly yellow color. Slightly darker shaded regions surrounding the lighter shaded regions express regions with lower temperature, where on the color screen the colors are changed from blue color to green color in gradation.

In FIG. 8A and FIG. 8B, it is understood that regions which indicate the highest temperature (the regions of red color on the color screen) minimally exist in the semiconductor module 1 according to the embodiment compared to the semiconductor module 1A. Particularly, to focus on the second semiconductor chip Q2 and the fourth semiconductor chip Q4 that are disposed adjacently to each other and are liable to be affected by the heat interference from each other and to compare the semiconductor module 1 according to the embodiment and the semiconductor module 1A, the shade which expresses a temperature of the second semiconductor chip Q2 itself and the shade which expresses a temperature of the fourth semiconductor chip Q4 itself are the darkest in the semiconductor module 1A (see FIG. 8A). However, in the semiconductor module 1 according to the embodiment, a region much darker compared to the semiconductor module 1A does not exist (see FIG. 8B). It is considered that, in the semiconductor module 1 according to the embodiment, the second semiconductor chip Q2 and the fourth semiconductor chip Q4 adopt the oblique arrangement and hence, the heats that the second semiconductor chip Q2 and the fourth semiconductor chip Q4 generate can be easily dissipated.

That is, out of the neighboring sides where the third wiring pattern 30 and the fourth wiring pattern 40 are disposed adjacently to each other, a distance between the right side 33 (see FIG. 2) of the third wiring pattern 30 that is the neighboring side on a third wiring pattern 30 side and the first long side b1 (see FIG. 2) of the second semiconductor chip Q2 that is mounted on the third wiring pattern 30 becomes wider due to the oblique arrangement of the second semiconductor chip Q2. In the same manner, a distance between the left side 43 (see FIG. 2) of the fourth wiring pattern 40 that is the neighboring side on a fourth wiring pattern 40 side and the second long side b2 (see FIG. 2) of the fourth semiconductor chip Q4 that is mounted on the fourth wiring pattern 40 also becomes wider due to the oblique arrangement of the fourth semiconductor chip Q4.

Specifically, the right side 33 (see FIG. 2) of the third wiring pattern 30 extends in a vertical direction along the y axis, and the second semiconductor chip Q2 adopts the oblique arrangement where the second semiconductor chip Q2 is inclined by a predetermined angle (45 degrees in this embodiment) in a counterclockwise direction with respect to the right side 33 (see FIG. 2) of the third wiring pattern 30. With such arrangement, a distance between the first long side b1 (see FIG. 2) of the second semiconductor chip Q2 and a right side 33 of the third wiring pattern 30 is widened gradually in a direction toward a second short side a2 (see FIG. 2) of the second semiconductor chip Q2. Accordingly, the distance between the second semiconductor chip Q2 and the right side 33 of the third wiring pattern 30 is, for example, wider than a corresponding width in a case where the second semiconductor chip Q2 is parallel to a right side 233 of the third wiring pattern 230 as the semiconductor module 1A illustrated in FIG. 5.

Further, the left side 43 (see FIG. 2) of the fourth wiring pattern 40 extends in a vertical direction along the y axis, and the fourth semiconductor chip Q4 adopts the oblique arrangement where the fourth semiconductor chip Q4 is inclined by a predetermined angle (45 degrees in this embodiment) in a clockwise direction with respect to the left side 43 (see FIG. 2) of the fourth wiring pattern 40. With such an arrangement, a distance between the first long side b2 (see FIG. 2) of the fourth semiconductor chip Q4 and a left side 43 of the fourth wiring pattern 40 is widened gradually in a direction toward a second short side a2 (see FIG. 2) of the fourth semiconductor chip Q4. Accordingly, the distance between the fourth semiconductor chip Q4 and the left side 43 of the fourth wiring pattern 40 is, for example, wider than a corresponding width in a case where the fourth semiconductor chip Q4 is parallel to a left side 243 of the fourth wiring 240 pattern as the semiconductor module 1A illustrated in FIG. 5.

In this manner, the second semiconductor chip Q2 has the wide distance with respect to the right side 33 of the third wiring pattern on which the second semiconductor chip Q2 is mounted, and the fourth semiconductor chip Q4 has the wide distance with respect to the left side 43 of the fourth wiring pattern on which the fourth semiconductor chip Q4 is mounted. Accordingly, the distance between the second semiconductor chip Q2 and the fourth semiconductor chip Q4 is, for example, wider than a corresponding width in a case where the second and fourth semiconductor chips Q2, Q4 are disposed parallel to each other as the semiconductor module 1A illustrated in FIG. 5. As a result, it is possible to suppress the interference of heats of the second and fourth semiconductor chips Q2, Q4 and hence, the increase of temperatures of the second semiconductor chips Q2 and the fourth semiconductor chips Q4 can be suppressed.

Further, a semiconductor chip that is also a heat generating source is not mounted on the second wiring pattern 20. Accordingly, with respect to a temperature of a wiring pattern, the temperature of the second wiring pattern 20 becomes lower than a temperature of the third wiring pattern 30 on which the second semiconductor chip Q2 is mounted and a temperature of the fourth wiring pattern 40 on which the fourth semiconductor chip Q4 is mounted. Heat is transferred from a side having a high temperature to a side having a low temperature. Accordingly, by arranging the second wiring pattern having a low temperature between the second semiconductor chip Q2 that is also a heat generating source and the fourth semiconductor chip Q4 that is also a heat generating source, the interference of heats between the second and fourth semiconductor chips Q2, Q4 can be reduced and hence, the increase of the temperatures of the second and fourth semiconductor chips Q2, Q4 can be suppressed.

Further, also in surroundings around the semiconductor chips Q1 to Q4 and in a wide range away from the semiconductor chips Q1 to Q4, a slightly darker shaded region expressing a low temperature is slightly large in amount in the semiconductor module 1 according to the embodiment compared to the semiconductor module 1A.

This is because, in the semiconductor module 1 according to the embodiment, as described previously, the inner lead portion 52*a* (see FIG. 2) of the second power source terminal 52 and the inner lead portions 61*a*, 62*a* (see FIG. 2) of the first and second intermediate point terminals 61, 62 have large width compared to the semiconductor module 1A. Accordingly, an advantageous effect of dissipating heats from these respective terminals is large and hence, it is considered that point also contributes to the suppression of the temperature at a low level in the wide range away from the semiconductor chips Q1 to Q4.

A measurement result obtained by measuring the temperatures of the semiconductor chips Q1 to Q4 in the semiconductor module according to the embodiment and the semiconductor module 1A is described in Table 9. Temperatures (° C.) indicated in Table 9 are temperatures at the center positions of surfaces (surfaces on a source electrode S side) of the semiconductor chips Q1 to Q4.

As illustrated in FIG. 9, to compare the semiconductor module 1 according to the embodiment and the semiconductor module 1A, the semiconductor module 1 according to the embodiment exhibits a lower temperature in all semiconductor chips Q1 to Q4. Particularly, to compare the second semiconductor chip Q2 and the fourth semiconductor chip Q4 of the semiconductor module 1 that are obliquely arranged with the second semiconductor chip Q2 and the fourth semiconductor chip Q4 of the semiconductor module 1A that are disposed parallel to each other and are disposed adjacently to each other, the second semiconductor chip Q2 and the fourth semiconductor chip Q4 of the semiconductor module 1 according to the embodiment exhibits a lower temperature than the second semiconductor chip Q2 and the fourth semiconductor chip Q4 of the semiconductor module 1A.

Specifically, in the semiconductor module 1A, the temperature of the second semiconductor chip Q2 is 141.55° C. and the temperature of the fourth semiconductor chip Q4 is 141.54° C. On the other hand, in the semiconductor module 1, the temperature of the second semiconductor chip Q2 is 134.56° C. and the temperature of the fourth semiconductor chip Q4 is 134.45° C. In this manner, the temperature of the semiconductor module 1 according to the embodiment is substantially 7° C. low compared to the temperature of the semiconductor module 1A.

With respect to the first semiconductor chip Q1 and the third semiconductor chip Q3, the arrangement of the semiconductor chips Q1, Q3 of the semiconductor module 1 according to the embodiment is substantially equal to the arrangement of the semiconductor chips Q1, Q3 of the semiconductor module 1A. However, as illustrated in FIG. 8A and FIG. 8B, the temperature of the semiconductor module 1 is lower than the temperature of the semiconductor module 1A although a temperature difference is slight.

In this manner, it may be considered the reason that the temperatures of the second semiconductor chip Q2 and the fourth semiconductor chip Q4 are particularly suppressed to low temperatures is that these second semiconductor chip Q2 and the fourth semiconductor chip Q4 are arranged obliquely as illustrated in FIG. 1.

That is, by adopting the configuration where the second semiconductor chip Q2 and the fourth semiconductor chip Q4 are arranged obliquely, a distance between the second semiconductor chip Q2 and the fourth semiconductor chip Q4 is widened and hence, it is possible to easily dissipate heats generated by the second semiconductor chip Q2 and the fourth semiconductor chip Q4 and hence, it is possible to suppress the interference between heats of the semiconductor chips Q2, Q4. Accordingly, it is possible to suppress the temperatures of the second semiconductor chip Q2 and the fourth semiconductor chip Q4 of the semiconductor module 1 to low temperatures compared to the temperatures of the second semiconductor chip Q2 and the fourth semiconductor chip Q4 of the semiconductor module 1A.

As has been described heretofore, in the semiconductor module 1 according to the embodiment, both the current path (solid line A) when both the first semiconductor chip Q1 and the fourth semiconductor chip Q4 are turned on, and the current path (broken line B) when both the third semiconductor chip Q3 and the second semiconductor chip Q2 are turned on can be shortened respectively. Accordingly, a parasitic inductance at the time of operating the bridge circuit can be reduced.

Further, according to the semiconductor module 1 of the embodiment, an adverse effect of the heats generated by the semiconductor chips Q1 to Q4 can be suppressed. Particularly, due to the oblique arrangement of the second semiconductor chip Q2 and the fourth semiconductor chip Q4, it is possible to suppress the interference of heats between the second and fourth semiconductor chips Q2, Q4.

Further, in the semiconductor module 1 according to the embodiment, the second power source terminal 52, and the first and second intermediate point terminals 61, 62 have a large width respectively. Accordingly, an effect of dissipating heat from these terminals is large. Also with such a heat dissipation effect, it is possible to suppress not only temperatures of the semiconductor chips Q1 to Q4 but also temperatures of ranges far away from the semiconductor chips Q1 to Q4 to low temperatures.

The present invention is not limited to the embodiment described above, and can be carried out in various modifications without departing from the gist of the present invention. For example, the following modifications can be also carried out.

(1) In the embodiment described above, it is not always necessary that the first oblique side 21 and the second oblique side 22 that the protruding portion 23 formed on the second wiring pattern 20 includes are each formed of a straight line, and may be formed of a bent line that is curved gently, or may be formed of a line that has unevenness to some extent. These lines are also included in the first oblique side and the second oblique side described in claims of the present invention. Further, with respect to the protruding portion, in FIG. 1 and FIG. 2 that are used in the description of the embodiment described above, the case is exemplified where a distal end of the protruding portion 23 is sharpened. However, the protruding portion having a round distal end and the protruding portion having a flat distal end are also included in the protruding portion described in claims.

(2) In the embodiment described above, the case is exemplified where an angle made by the first oblique side 21 and the second oblique side that the protruding portion 23 formed on the second wiring pattern 20 includes is set to 90 degrees. However, it is not always necessary that the angle is 90 degrees. It is possible to set an angle that can make the current paths that extend from the second semiconductor chip Q2 and the fourth semiconductor chip Q4 and reach the second power source terminal 52 via the second wiring pattern 20 as short as possible and reduce the interference of heats of the second and fourth semiconductor chips Q2, Q4.

(3) In the embodiment described above, the description has been made with respect to the realization of the reduction of a parasitic inductance and the suppression of the interference of heats between the semiconductor chips. However, to consider the suppression of interference of heats of the semiconductor chips as a main object to be realized, it is not always necessary to limit the semiconductor module according to the present invention to the semiconductor module 1 illustrated in FIG. 1.

For example, in the semiconductor module 1A prepared for comparison with the semiconductor module 1 according to the embodiment, the second wiring pattern 220 is formed into a wiring pattern having a tapered protruding portion 23 in the same manner as the semiconductor module 1 according to the embodiment, and the second semiconductor chip Q2 and the fourth semiconductor chip Q4 are obliquely arranged. With such a configuration, in the same manner as the semiconductor module 1 according to the embodiment, it is possible to suppress the interference of heats of the second and fourth semiconductor chips Q2, Q4.

Further, also in the semiconductor module 1A, the inner lead of at least one terminal out of the first, second power source terminals 251, 252, and the first and second intermediate point terminals 261, 262 may have a wide width compared to the inner leads of other terminals formed on the semiconductor module 1A. With such a configuration, the temperatures of a wide range away from the semiconductor chips Q1 to 04 can be suppressed to low temperatures.

(4) It is not always necessary that the first wiring pattern 10 and the third and fourth wiring patterns 30, 40 have shapes described in FIG. 1, and these members can have suitably optimum shapes. Further, in the embodiment described above, the semiconductor chips Q1 to Q4 have a rectangular shape. However, the semiconductor chips Q1 to Q4 may have a square shape. Further, in the embodiment described above, the substrate 70 is formed of the DCB. However, it is not always necessary that the substrate 70 is formed of the DCB plate.

(5) It is not always necessary that the semiconductor chips Q1 to Q4 are formed of a MOSFET. The semiconductor chips Q1 to 04 may be formed of other semiconductor chips such as an insulated gate bipolar transistor (IGBT).

(6) The directions of the respective semiconductor chips Q1 to Q4 at the time of mounting the semiconductor chips Q1 to Q4 on the corresponding wiring patterns 10, 30 and 40 are not limited to the directions described in FIG. 1 and FIG. 2. To describe the semiconductor chip Q2 and the semiconductor chip Q4 with reference to FIG. 2, firstly, the semiconductor chip Q2 may be rotated by 90 degrees in a counterclockwise direction from the position illustrated in FIG. 2 so as to arrange the semiconductor chip Q2 such that the long side b2 extends along the oblique side 31 of the third wiring pattern 30, the second connection member 82 may be extended from the source electrode S such that the second connection member 82 traverses the long side b2 of the semiconductor chip Q2, and may be connected to the second wiring pattern 20. Further, the semiconductor chip Q2 may be rotated by 90 degrees in a clockwise direction from the position illustrated in FIG. 2 so as to arrange the semiconductor chip Q2 such that the long side b1 extends along the oblique side 31 of the third wiring pattern 30, the second connection member 82 may be extended from the source electrode S such that the second connection member 82 traverses the long side b1 of the semiconductor chip Q2, and may be connected to the second wiring pattern 20.

The same substantially goes for the semiconductor chip Q4. The semiconductor chip Q4 may be rotated by 90 degrees in a clockwise direction from the position illustrated in FIG. 2 so as to arrange the semiconductor chip Q4 such that the long side b1 extends along the oblique side 41 of the fourth wiring pattern 40, the fourth connection member 84 may be extended from the source electrode S such that the fourth connection member 84 traverses the long side b2 of the semiconductor chip Q4, and may be connected to the second wiring pattern 20. Further, the semiconductor chip Q4 may be rotated by 90 degrees in a counterclockwise direction from the position illustrated in FIG. 2 so as to arrange the semiconductor chip Q4 such that the long side b2 extends along the oblique side 41 of the fourth wiring pattern 40, the fourth connection member 84 may be extended from the source electrode S such that the fourth connection member 84 traverses the long side b2 of the semiconductor chip Q4, and may be connected to the second wiring pattern 20.

Further, also with respect to the first semiconductor chip Q1 and the third semiconductor chip Q3, the wiring pattern 10 can be arranged in a state where these semiconductor chips Q1, Q3 are rotated. For example, these semiconductor chips Q1, Q3 may be arranged on the wiring pattern 10 in a state where the semiconductor chips Q1, Q3 are rotated by a predetermined angle in a clockwise direction or in a counterclockwise direction respectively.

(7) The shapes, the numbers, the sizes, the positions and the like of the constitutional elements according to the present invention are not limited to FIG. 1 and FIG. 2, and can be suitably changed provided that the technical features of the present invention are not impaired.

The invention claimed is:

1. A semiconductor module comprising: first to fourth semiconductor chips; first to fourth wiring patterns; a first power source terminal; a second power source terminal; a first intermediate point terminal; and a second intermediate point terminal thus forming a bridge circuit in the semiconductor module, wherein the bridge circuit is formed where the first semiconductor chip and the third semiconductor chip are chips disposed on a high side, and the second semiconductor chip and the fourth semiconductor chip are chips disposed on a low side, wherein the first power source terminal is connected to the first wiring pattern and the first semiconductor chip and the third semiconductor chip are mounted on the first wiring pattern, the second power source terminal is connected to the second wiring pattern, the first intermediate point terminal is connected to the third wiring pattern and the second semiconductor chip is mounted on the third wiring pattern, and the second intermediate point terminal is connected to the fourth wiring pattern and the fourth semiconductor chip is mounted on the fourth wiring pattern, the first wiring pattern is configured such that, assuming one side out of a plurality of sides of the first wiring pattern as a first side of the first wiring pattern, a recessed portion having a recessed shape as viewed in a plan view is formed in the first wiring pattern within a predetermined range of the first side, and the first semiconductor chip and the third semiconductor chip sandwich the recessed portion, and, are mounted at positions disposed adjacently to the recessed portion, the second wiring pattern is configured such that three sides of the second wiring pattern is surrounded by the recessed portion formed in the first wiring pattern, a portion of the second wiring pattern is disposed so as to protrude outward from an opening of the recessed portion, and a protruding portion having a tapered shape that has a first oblique side and a second oblique side is formed on at least a part of the portion that protrudes from the recessed portion, the third wiring pattern and the fourth wiring pattern are disposed along the first side of the first wiring pattern from one end portion to an other end portion, an oblique side that extends along the first oblique side that the protruding portion having a tapered shape has is formed on the third wiring pattern, and an oblique side that extends along the second oblique side that the protruding portion having a tapered shape has is formed on the fourth wiring pattern, the first to fourth semiconductor chips each have at least a first electrode and a second electrode, the first semiconductor chip is configured such that, assuming one side out of a plurality of sides of the first semiconductor chip as a first side of the first semiconductor chip, the first side of the first semiconductor chip is disposed along the first side of the first wiring pattern, and the first electrode that the first semiconductor chip has is connected to the third wiring pattern via a first connection member, the second semiconductor chip is configured such that, assuming one side out of a plurality of sides of the second semiconductor chip as a first side of the second semiconductor chip, the first side of the second semiconductor chip is disposed along the oblique side formed on the third wiring pattern, and the first electrode that the second semiconductor chip has is connected to the second wiring pattern via a second connection member, the third semiconductor chip is configured such that, assuming one side out of a plurality of sides of the third semiconductor chip as a first side of the third semiconductor chip, the first side of the third semiconductor chip is disposed along the first side of the first wiring pattern, and the first electrode that the third semiconductor chip has is connected to the fourth wiring pattern via a third connection member, and the fourth semiconductor chip is configured such that, assuming one side out of a plurality of sides of the fourth semiconductor chip as a first side of the fourth semiconductor chip, the first side of the fourth semiconductor chip is disposed along the oblique side formed on the fourth wiring pattern, and the first electrode that the fourth semiconductor chip has is connected to the second wiring pattern via a fourth connection member.

2. The semiconductor module according to claim 1 wherein, the first power source terminal and the second power source terminal are disposed adjacently to each other, and the first intermediate point terminal and the second intermediate point terminal are disposed adjacently to each other, and the first power source terminal and the second power source terminal, and the first intermediate point terminal and the second intermediate point terminal are disposed so as to be positioned on opposite sides of the semiconductor module in a state where an outer lead portion of the first power source terminal and an outer lead portion of the second power source terminal, and an outer lead portion of the first intermediate point terminal and the outer lead portion of the second intermediate point terminal sandwich the second wiring pattern therebetween.

3. The semiconductor module according to claim 1, wherein an inner lead portion of at least one terminal of the first power source terminal, the second power source terminal, the first intermediate point terminal and the second intermediate point terminal has a large width compared to inner lead portions of other terminals formed on the semiconductor module.

4. The semiconductor module according to claim 1, wherein the first connection member extends from a side of the first side of the first semiconductor chip orthogonal to the first side of the first semiconductor chip, and is connected to the third wiring pattern, the second connection member extends from a side of the first side of the second semiconductor chip orthogonal to the first side of the second semiconductor chip, and is connected to the second wiring pattern, the third connection member extends from a side of the first side of the third semiconductor chip orthogonal to the first side of the third semiconductor chip, and is connected to the fourth wiring pattern, and the fourth connection member extends from a side of the first side of the fourth semiconductor chip orthogonal to the first side of the fourth semiconductor chip, and is connected to the second wiring pattern.

* * * * *